(12) United States Patent
Crowley et al.

(10) Patent No.: US 10,910,606 B2
(45) Date of Patent: Feb. 2, 2021

(54) BATTERY SYSTEM

(71) Applicant: RELECTRIFY HOLDINGS PTY LTD, Victoria (AU)

(72) Inventors: Daniel Crowley, Victoria (AU); Jan Valentin Muenzel, Victoria (AU); Zhe Zhang, Victoria (AU); Daniel Follent, Victoria (AU)

(73) Assignee: Relectrify Holdings PTY LTD, Victoria (AU)

( * ) Notice: Subject to any disclaimer, the term of this patent is extended or adjusted under 35 U.S.C. 154(b) by 0 days.

(21) Appl. No.: 16/484,216

(22) PCT Filed: Feb. 7, 2018

(86) PCT No.: PCT/AU2018/050087
§ 371 (c)(1),
(2) Date: Aug. 7, 2019

(87) PCT Pub. No.: WO2018/145150
PCT Pub. Date: Aug. 16, 2018

(65) Prior Publication Data
US 2019/0363311 A1 Nov. 28, 2019

(30) Foreign Application Priority Data
Feb. 8, 2017 (AU) .............................. 2017900386

(51) Int. Cl.
*H01M 2/02* (2006.01)
*H01M 10/42* (2006.01)
(Continued)

(52) U.S. Cl.
CPC ....... *H01M 2/024* (2013.01); *H01M 10/4285* (2013.01); *H02J 7/0024* (2013.01);
(Continued)

(58) Field of Classification Search
CPC ......... H01M 2/024; H01M 2010/4271; H01M 10/4207; H01M 10/4285; H02J 7/0019;
(Continued)

(56) References Cited

U.S. PATENT DOCUMENTS

| 2004/0164706 A1 | 8/2004 | Osborne |
| 2007/0182377 A1* | 8/2007 | Vandensande ....... G01R 31/396 320/132 |

(Continued)

*Primary Examiner* — Brittany L Raymond
(74) *Attorney, Agent, or Firm* — Occhiuti & Rohlicek LLP

(57) ABSTRACT

The invention is directed to a battery system. The battery system includes a plurality of battery cell units, one or more switching assemblies operatively configured to selectively electrically connect any one of the battery cell units from the plurality of battery cell units in series with any other battery cell unit from the plurality of battery cell units, and disconnect any one of the battery cell units from being connected with any other battery cell units from the plurality of battery cell units, wherein the switching assemblies are configured to selectively connect and disconnect the battery cell units based on a set of control parameters. The battery system further includes two or more controllers for determining the set of control parameters and controlling the switching assemblies so as to provide a system output having a controllable voltage profile. The two or more controllers are configured for synchronised operation.

22 Claims, 23 Drawing Sheets

(51) Int. Cl.
    *H03K 17/687*     (2006.01)
    *H02M 7/12*     (2006.01)
    *H02J 7/00*     (2006.01)

(52) U.S. Cl.
    CPC .......... *H02M 7/12* (2013.01); *H03K 17/6872* (2013.01); *H01M 2010/4271* (2013.01)

(58) Field of Classification Search
    CPC ...... H02J 7/0024; H02J 7/0047; H02J 7/0048; H02M 7/12; H03K 17/6872
    See application file for complete search history.

(56) References Cited

U.S. PATENT DOCUMENTS

| | | | |
|---|---|---|---|
| 2009/0278489 A1* | 11/2009 | St-Jacques | H02J 7/0016 320/103 |
| 2012/0146588 A1* | 6/2012 | Ishibashi | H02J 7/0018 320/138 |
| 2013/0069598 A1 | 3/2013 | Tanaka et al. | |
| 2014/0028249 A1* | 1/2014 | Larsen | H02M 7/797 320/107 |
| 2015/0194707 A1 | 7/2015 | Park | |
| 2018/0017627 A1* | 1/2018 | Shimizu | H01M 10/441 |

\* cited by examiner

BATTERY SYSTEM

RELATED APPLICATIONS

This application is the national phase under 35 USC 371 of international Application No. PCT/AU2018/050087, filed Feb. 7, 2018, which claims priority to Australian patent application 2017900386 filed Feb. 8, 2017, the contents of which are to be taken as incorporated herein by reference.

TECHNICAL FIELD

The invention described herein generally relates to battery systems.

BACKGROUND ART

Energy storage systems for applications such as full electric vehicles, hybrid electric vehicles, and stationary energy storage in grid connected or off grid applications, frequently include an arrangement of multiple energy storage cell units.

In energy storage systems that include multiple energy storage units, differences between cell units can impact how the overall energy storage system performs. In particular, in battery systems including re-used battery cell units, such differences between the cell units can be prominent. Moreover, a single bad cell unit may undesirably affect the performance and reliability of the overall system.

Conventional battery management systems typically use switched resistors to dissipate surplus energy from higher charged cell units, or switched capacitors or switched inductors to transfer energy from higher charged cell units to lower charged cell units. The primary role of these systems is to equalise the state of charge differences of cell units connected in series at a particular point in the charge discharge cycles, for example at the end of charging. Equalising the state of charge at one specific point in the cycle ensures that the lowest capacity cell unit in a series arrangement is able to be fully charged and discharged throughout the cycle. It does not, however, allow higher capacity cell units to be fully charged and discharged throughout the cycle.

In order to overcome the limitations posed by the lowest capacity cell unit in an energy storage system comprising multiple cell units connected in series, a more advanced approach is required. It is an aim of the invention to provide a battery system which overcomes or ameliorates one or more of the disadvantages or problems described above, or which at least provides the consumer with a useful choice.

SUMMARY OF THE INVENTION

According to one aspect of the invention, there is provided a battery system including
a plurality of battery cell units connected in series,
one or more switching assemblies, and
two or more controllers for determining one or more control parameters and controlling the switching assemblies based on the control parameters to selectively
disconnect any one of the battery cell units from being connected with any other battery cell units from the plurality of battery cell units, and
electrically connect in series any one of the battery cell units with any other battery cell unit from the plurality of battery cell units,
so as to provide a system output having a controllable voltage profile, the two or more controllers being configured for synchronised operation.

In one embodiment, there is provided a battery system wherein the controllers control the switching assemblies to selectively allow
operation in a first state in which a first battery cell unit and a second battery cell unit are electrically connected in series and a third battery cell unit is disconnected,
operation in a second state in which the first battery cell unit and the third battery cell unit are electrically connected in series and the second battery cell unit is disconnected, and
operation in a third state in which the second battery cell unit and the third battery cell unit are electrically connected in series and the first battery cell unit is disconnected.

At least one of the controllers may be configured to generate a synchronisation signal for time synchronisation of the two or more controllers.

The battery system may further include a dedicated synchronisation line for communicating a time synchronisation signal between the two or more controllers.

The output voltage profile may be DC or rectified DC output. Alternatively, the output voltage profile may be AC output.

The battery system may further include an output module for controlling the system output, wherein the output module has one or more output switches for selectively connecting or disconnecting the connected battery cell units to the system output.

The battery system may further include a capacitor at the system output for smoothing an output voltage. Moreover, the battery system may further include an inductor at the system output for smoothing an output current.

The battery system may include one or more battery cell modules, each battery cell module may include a battery cell unit, and each battery cell unit may include one or more battery cells. In one embodiment, the output of each battery cell module may equal the output of its corresponding battery cell unit.

The plurality of battery cell units may include two or more battery cell units that are pre-used and/or otherwise differ in charge storage capacity by a considerable amount. This amount may in some cases be a difference in charge storage capacity of 5% or more.

Each battery cell module may include a switching assembly for connecting or disconnecting (or bypassing) a corresponding battery cell unit. The switching assembly may include a first switch for connecting the corresponding battery cell unit, and a second switch for disconnecting the corresponding battery cell unit.

One of the control parameters may include a time shift for each of the battery cell units. The time shift may determine a time for electrically connecting the respective battery cell unit in series with one or more other battery cell units in the plurality of battery cell units.

One of the control parameters may include a duty cycle for each of the battery cell units. The duty cycle may determine a percentage of time for maintaining an electrical connection for the respective battery cell unit when it is electrically connected in series with one or more other battery cell units in the plurality of battery cell units.

The control parameters may include duty cycle for each battery cell unit, determined by one of the controllers based on respective cell unit voltage measurements. The duty cycle may determine the percentage of time that the respective battery cell unit is connected during operation. The ratio between the total sum of the duty cycles of cell units and a duty cycle of 100% may be proportional to the ratio between the battery system output voltage and the average voltage of the battery cell units within the battery system. In one embodiment, the ratio between the total sum of the duty cycles of cell units and a duty cycle of 100% may be equal to the ratio between the battery system output voltage and the average voltage of each battery cell unit. In some embodiments, the ratio between the total sum of the duty cycles of cell units and the duty cycle for each battery cell unit may be equal to or scaled to a value equal to the ratio between the battery system output voltage and the average voltage of each battery cell unit.

In one embodiment, the duty cycle (D) for each battery cell module may be calculated based on the following two formulas for discharging, and charging, respectively:

$$D_{x,discharge} = \frac{C_x \times Z}{\sum_{\alpha=1}^{N}(C_\alpha) - \sum_{\beta \in Y}(C_\beta)}$$

$$D_{x,charge} = \frac{(Cap_x - C_x) \times Z}{\sum_{\alpha=1}^{N}(Cap_\alpha - C_\alpha) - \sum_{\beta \in Y}(Cap_\beta - C_\beta)}$$

Wherein, $D_{x,charge}$ is the duty cycle for a battery cell unit 'x' during charging, $D_{x,discharge}$ is the duty cycle for a battery cell unit 'x' during discharging, 'Cap' is the total capacity in Ampere-hours a given battery cell unit can store when fully charged, determined e.g. by on occasion fully charging and fully discharging a battery cell unit, and measuring the amount of charge the battery cell unit was able to provide throughout its transition between states of fully charged and fully discharged, $C_x$ is the current level of stored charge in Ampere-hours of cell unit 'x', X is a numerical value assigned to battery cell unit 'x' (where each battery cell unit is assigned a number from 1 to N), N is the total number battery cell units in the battery system, Y is the collection of the indices 'x' of the specific battery cell units that are disabled from use temporarily or permanently, Z is the number of battery cell units required to be connected at any given time, and α and β are variables used for summation in the equation.

In some embodiments, the duty cycle (D) for each battery cell unit may be dependent on the present voltage of the respective battery cell unit, and the present voltage of one or more of the plurality of other battery cell units in the battery system and/or the measured or predetermined battery system output current or voltage.

Elaborating further, the duty cycle (D) for each battery cell unit may be calculated based on the charge level of the particular battery cell unit $C_x$, the total charge level of the battery system $C_{tot}$, and the number of battery cell units simultaneously connected at any given time Z.

In some embodiments, the system may scale the duty cycle value up or down accordingly to provide the desire output profile. In one example, the system may scale down duty cycle values exceeding 1, and scale up duty cycle values below 1.

In some embodiments, the system may detect battery cell units having performance parameters outside the norm or a predetermined range and disconnect the detected battery cell units. The performance parameters may include voltage and/or current output, temperature and the like.

The control parameters may further include time shift value for each battery cell unit. The time shift value may be calculated by one of the controllers based on a total number of battery cell units in the battery system and/or the desired battery system output voltage. The time shift value may determine a time offset for each period of the start of the duty cycle of the respective battery cell unit. More particularly, the time shift value may determine the start of a control reference period for each of the battery cell units. In other words, the time shift value may determine when the respective battery cell unit is switched on and off based on the duty cycle.

In one embodiment, the time shift (T) for each battery cell unit may be calculated based on the following formula:

$$T_x = T_D \times \frac{X-1}{N}$$

wherein, $T_x$ is the time shift value for battery cell unit 'x', $T_D$ is the period of the duty cycle, $$T_D = \frac{1}{f},$$

where f is the control frequency of the battery system,

X is a numerical value assigned to battery cell unit 'x' (where each battery cell is assigned a number from 1 to N), and N is the total number battery cell units in the battery system.

In other embodiments, the time shift value may be determined iteratively. For example, the time shift value of a first battery cell unit may be 0, and the time shift value of a second battery cell unit may be the time shift of the first battery cell unit plus the duty cycle of the first battery cell unit, and so forth.

The battery system may employ any suitable control reference frequency. In one embodiment, the battery system employs high frequency operation. More particularly, the control frequency may be between 0.1 Hz to 10 kHz. In some embodiments, the control frequency may be less than 40 Hz. In some embodiments, the control frequency may be over 70 Hz.

In some embodiments, the control parameters may include a number of battery cell units to be connected in series at any given time to provide the predetermined output. In one example, where the battery system output is to be a DC waveform and all battery cell units have the same present voltage, the number of battery cell units to be connected in series at any given time Z may be calculated using the following formula:

$$Z = \frac{V_{out}}{V_{cell}}$$

wherein,

Z is the number of battery cell units to be connected in series at any given time, $V_{out}$ is the predetermined target output voltage of the battery system, and $V_{cell,x}$ is the voltage of a battery cell unit of the battery system.

The system output voltage profile may be a constant voltage (DC), a repeating oscillating voltage (AC), a rectified oscillating voltage waveform, or any other waveform.

In some embodiments, the system output voltage may be a user defined value. In other embodiments, the predetermined output may be an input from an electrical device or appliance to be powered by the battery system or to provide power to the battery system.

In some embodiments, the battery system may include an output filter for smoothing the output. Any suitable output filter may be used. In one embodiment, the output filter is an LC circuit.

The battery system may further include a current sensor for measuring the output current of the battery system. In some embodiments, the battery system may include one or more output switches for selectively connecting or disconnecting the output of the battery system, for example to meet operation requirements such as battery system output voltage or current limitations.

Each battery cell unit may be controlled by a respective controller. Alternatively, two or more battery cell units are controlled by a shared controller. In one embodiment, at least one of the controllers is a central controller for generating a control signal for the one or more other controllers.

In one embodiment, one of the controllers is a central controller, and each battery cell unit is associated with a decentralised cell unit controller for communication with the central controller and controlling the switching assemblies. In particular, each battery cell module may include a battery cell unit, a switching assembly for connecting or disconnect the battery cell unit to the system, and a cell unit controller for controlling the switching assembly and communicating with the central controller. In this embodiment, the battery system may include shared cabling for coupling the central controller to the battery cell modules. In particular, a single control communication line connecting to the central controller may be connected to each cell unit controller, and may transmit one- or multi-directional communication between the central controller and cell unit controllers. In addition, a single time signal line connection to the central controller may be connected to each cell unit controller, and may transmit a single time signal from any one controller to a multitude of other controllers, wherein the signal is used for time synchronisation of the central controller and cell unit controllers.

In some embodiments, the system may have a centralized or semi-centralised configuration. In particular, the centralized configuration may include a central controller which directly controls the cell unit switching assemblies with dedicated cabling connecting the central controller to the plurality of battery cell unit switching assemblies.

The semi-centralised configuration may include clusters or groups of battery cell units, and a single central controller having individual control lines connected to each cluster or group of battery cell units. Each cluster or group of battery cell units may share a single group controller.

Each battery cell unit may include one or a more battery cells and be connected to a switching assembly for selectively connecting the battery cell unit to, or disconnecting the battery cell unit from the battery system during operation. Each switching assembly may include one or more switching elements (such as MOSFETS, electromechanical contactors including double pole switches). In one embodiment, one or more of the switching assemblies each includes a maximum of two switching elements. Each switching assembly may be controlled using a single control signal that may incorporate electrical isolation. The electrical isolation may be provided by an opto-isolator, an isolation transformer, or other means of isolation. In some embodiments, the switching assembly may be connected to a battery cell unit controller.

In one embodiment, at least one switching assembly includes gate drive electronics for receiving control signals from at least one of the controllers, the gate drive electronics having one or more isolation elements for isolating the at least one switching assembly from the controllers, and one or more switching elements for conducting a current flowing in a direct electrical path between battery cell units connected in series; and wherein the number of isolation elements is fewer than the number of switching elements. The gate drive electronics may include an opto-coupler.

In one embodiment, a first switching assembly may be configured to control one or more corresponding battery cell units, the first switching assembly including gate drive electronics for receiving control signals from at least one of the controllers. The gate drive electronics may be at least partially powered by the one or more corresponding battery cell units.

In some embodiments, each battery cell units can comprise a combination of individual battery cell units and blocks of parallel connected cells. In this specification, the terms "battery cell unit" or "cell unit" can refer to an individual battery cell or a block of cells connected in parallel, or a multitude of individual battery cells or blocks of parallel cells or a mix thereof connected in series, and similar reasoning applies to variations of those terms, such as plurals. It can also refer to a block of cells connected in parallel or series in which one or more circuit components such as fuses, resistors or inductors are connected in series and/or parallel with individual cells.

In one embodiment, the central controller may be powered by one or more battery cell units. In addition, each cell unit controller may be powered by its respective battery cell unit.

The battery system may further include an AC/DC converter for converting a direct current signal at the battery system output into an alternating current. The battery system may further include an inverter. The battery system output may provide a specific DC output voltage profile as required by an input of the inverter.

The battery system may further include an H-bridge circuit for converting a rectified sine wave output signal to a full sine wave output signal.

Optionally, the battery system may further include a transformer. The transformer may alter a voltage amplitude at the system output.

According to another aspect of the invention, there is provided a battery pack system including two or more of the battery systems as previously described, wherein the battery systems are connected in parallel with one another. In one embodiment, the battery pack system controls the power contribution of each battery system by controlling the output voltage profile of each battery system. The output voltage profile of each battery system may be a DC voltage.

There is also disclosed herein, an energy storage system including
a plurality of energy storage cell units,
one or more switching assemblies operatively configured to selectively
electrically connect any one of the energy storage cell units from the plurality of energy storage cell units in series with any other energy storage cell unit from the plurality of energy storage cell units, and
disconnect any one of the energy storage cell units from being connected with any other energy storage cell units from the plurality of energy storage cell units, wherein the switching assemblies are configured to selectively connect and disconnect the energy storage cell units based on a set of control parameters, and
two or more controllers for determining the set of control parameters and controlling the switching assemblies so as to provide a system output having a controllable voltage profile, the two or more controllers being configured for synchronised operation.

The energy storage units may include battery cell units, capacitors, supercapacitors and the like, and/or any combination thereof.

According to a further aspect of the invention, there is provided a method for controlling a battery system as described in the preceding paragraphs.

In order that the invention may be more readily understood and put into practice, one or more preferred embodiments thereof will now be described, by way of example only, with reference to the accompanying drawings.

DETAILED DESCRIPTION OF PREFERRED EMBODIMENT(S)

Figure 1:
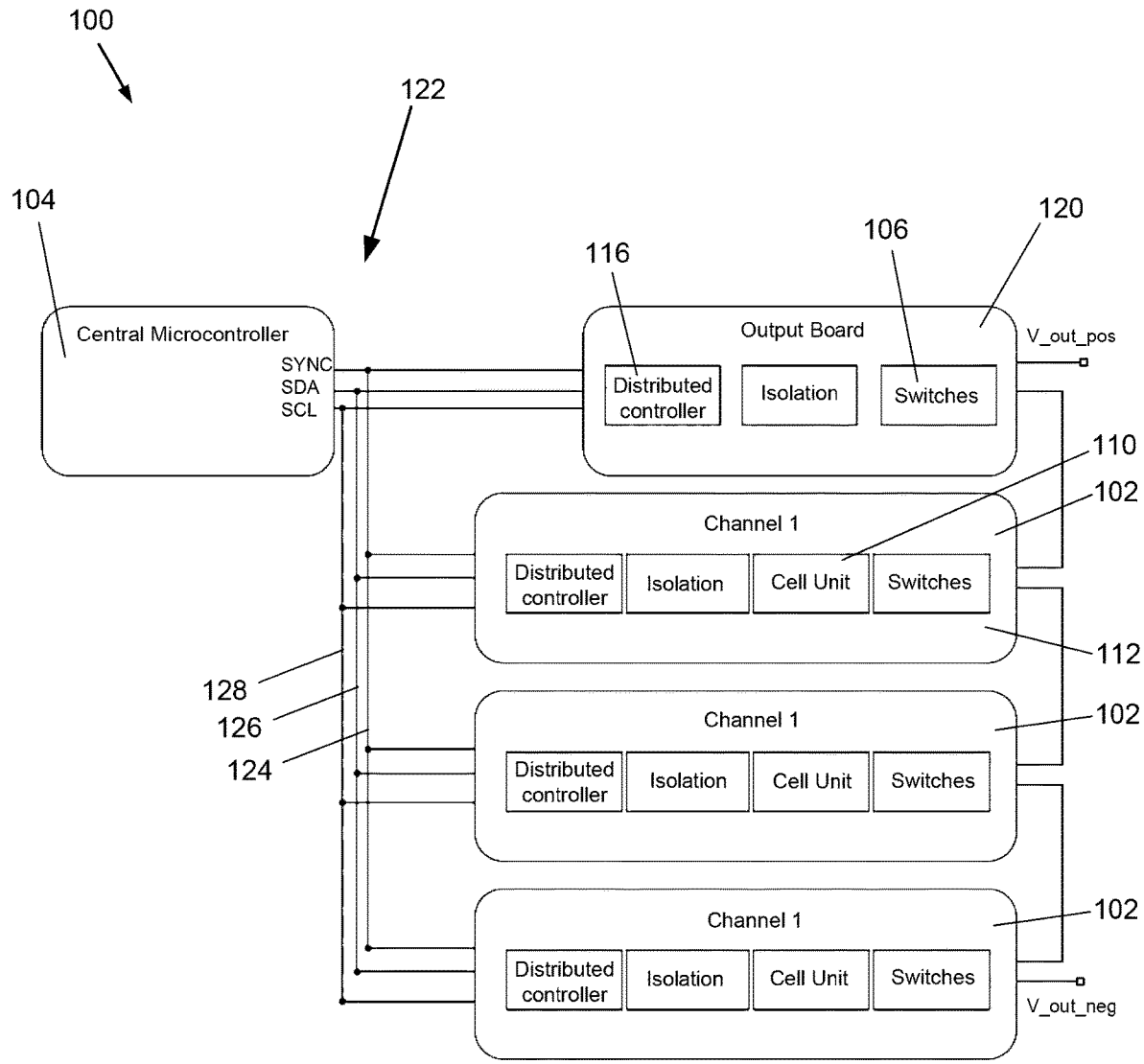
FIG. 1 is a schematic diagram of a battery system according to one embodiment of the invention.
Figure 2:
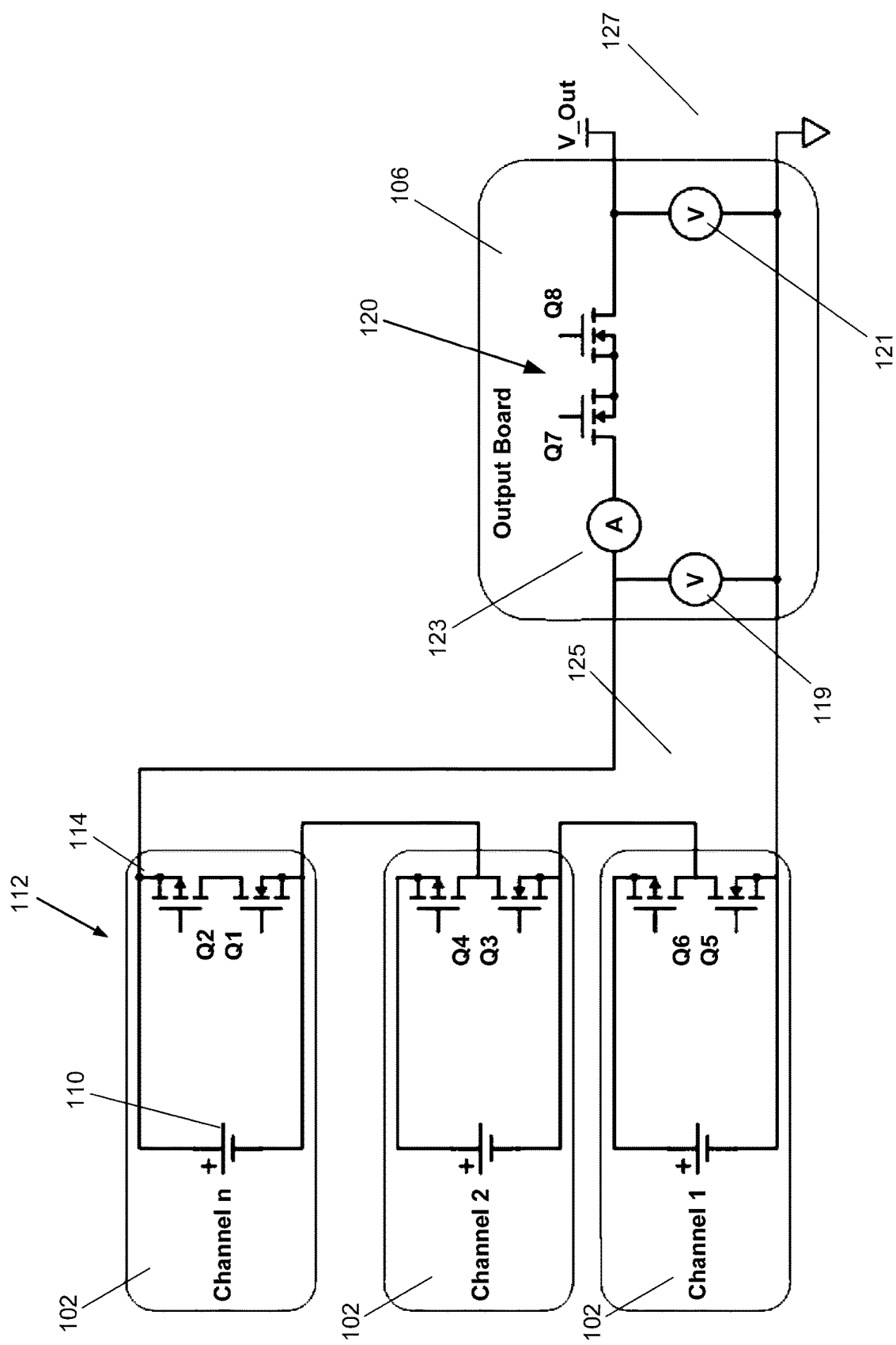
FIG. 2 is a schematic circuit diagram illustrating an output board of the battery system of FIG. 1.

As shown in FIGS. 1 and 2, battery system 100 includes a plurality of battery cell modules 102, a central controller 104 for controlling the operation of the battery cell modules 102, and an output module 106 for measuring and validating the output from the battery cell modules 102, and or processing the output to provide a desired output voltage profile. The output profile may be determined based on user inputs, or the voltage requirements of a device or appliance to be powered by the battery system 100.

The central controller 104 includes a microcontroller which determines a set of control parameters to control the battery cell modules 102 based on input parameters retrieved from the battery cell modules 102 such as the present voltage, maximum charged voltage, and minimum discharged voltage for each battery cell module 102, as well as voltage values for the overall battery system 100. The control parameters determine when and how each battery cell module 102 operates at any given point in time. In particular, the control parameters include duty cycle and time shift as explained in further detail below.

Each battery cell module 102 includes a cell microcontroller 108 for communicating with the central controller 104. Any suitable communication protocol may be used. In one embodiment, the central controller 104 communicates with the cell microcontrollers 108 on each of the battery cell module 102 as well as the output module 106 using I2C protocol.

Each battery cell module 102 further includes a battery cell unit 110 and a switching assembly 112. The switching assembly 112 comprises transistors 114 to selectively connect or disconnect (or bypass) the battery cell unit 110, and a switch control circuit (FIGS. 4 and 5) for controlling the transistors 114. In one embodiment, two power transistors (i.e. MOSFETs) are used for each switching assembly 112, one MOSFET for connecting the battery cell unit 110 and one for disconnecting the battery cell unit 110, for example, in a 'half-bridge' circuit configuration. The output of all connected battery cell modules 102 are electrically connected in series. Some further examples configurations of switching assemblies and cell units are described in PCT application no. PCT/AU2016/050917, the entire contents of which are incorporated herein by reference.

In this embodiment, the output module 106 includes an output microcontroller 116, and a set of output switches 106, which may be back-to-back NMOS MOSFETs. As more clearly shown in FIG. 2, the output module 106 further includes two voltage sensors 119, 121. The first voltage sensor 119 is connected in parallel with the cumulative voltage output terminal 125 of the battery cell modules 102. The second voltage sensor is connected in parallel with the cumulative output terminal 127 of the battery system 100. The output module further contains a current sensor 123 connected in series with the battery cell modules 102. The voltage sensors 119, 121 and the current sensor 123 may be used to measure battery system performance and provide battery system diagnostics. The output switches may provide processing of the battery system out, and/or protection for the battery system and/or electrical devices attached to the output.

Figure 3:
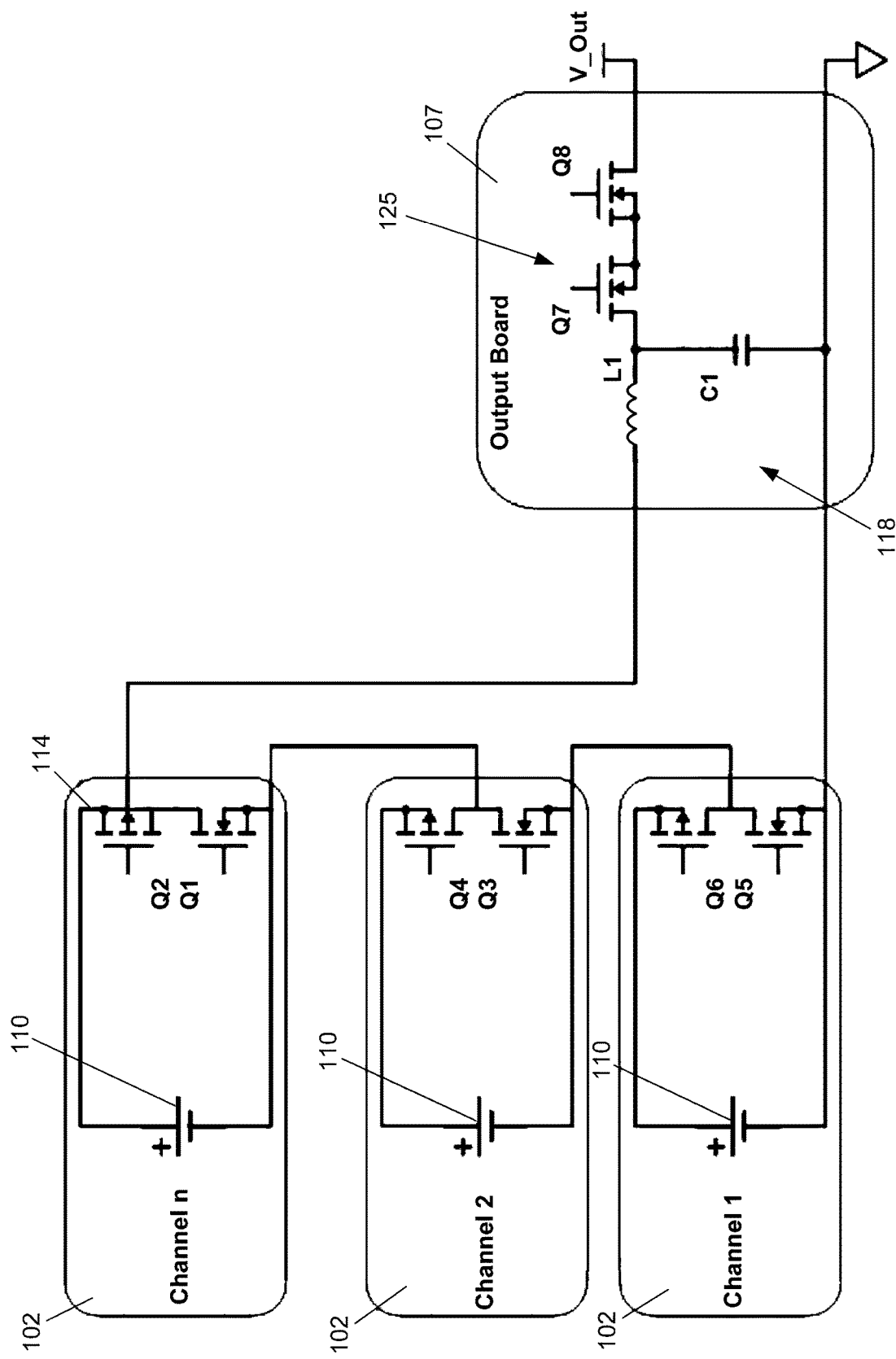
FIG. 3 is a schematic circuit diagram illustrating an alternative output board for the battery system of FIG. 1.

An alternative output module 107 is illustrated is FIG. 3. In this embodiment, the output module 107 includes a set of output switches 125, one a more voltage and current measurement sensors (not shown), and further includes an LC filter 118 for smoothing out the accumulated voltage and current output of the battery cell modules 102. The LC filter 118 is used to provide further stabilisation of the battery system output by reducing voltage variations and/or current spikes caused by switching of battery cell units 110. The output microcontroller 116 communicates with the central controller 104 and interfaces with the sensors and transistors 125. The transistors 125 can be used to disconnect the entire battery system 100 from an electrical device or appliance (not shown), either when instructed to do so by the central controller 104, or when the sensors on the output module 107 show a current or voltage that is outside expected operating thresholds.

In the embodiment shown in FIG. 1, the battery system 100 is configured according to a modular physical layout. In the modular physical layout, each battery cell module 102 is on a separate circuit board. This is beneficial in some situations, e.g. where the cell units 110 for each module 102 may experience some relative physical movement that could damage a shared circuit board. It is also advantageous in that the total number of battery cell units 110 which can be included in the battery system 100 is not fixed by the number of switching interfaces on a shared board, thereby allowing pack size to be changed simply by adding or removing battery cell module 102 with dedicated circuitry as shown in FIG. 1, rather than having to redesign a shared circuit board to cater for a different number of battery cell units 110.

In the module physical layout of the battery system 100, communication between the system components are carried out via modular control lines 122. Elaborating further, rather than each battery cell module 102 receiving one or more dedicated and unique control signals from a central controller 104, each battery cell module 102 is connected to the same set of control lines 122 and receives the same control signal from the central controller 104. The control signals include information of which battery cell module 102 is addressed, so a given message is only acted upon by one or more specific battery cell module 102 rather than all modules. The benefits of modular control are that the central controller 104 only has to provide one set of control lines 122 to which all battery cell module 102 connect (i.e. allowing a 'linear' control line arrangement connecting the central controller 104 to the battery cell module 102), rather than having a set of independent control lines running from the central controller 104 to each cell module 102 in a 'spider' arrangement. The modular control of the battery system 100 reduces cabling requirements and allows the number of battery cell module 102 to be altered easily, for example, by simply adding or reducing battery cell module 102 at the lower end of the layout shown in FIG. 1.

The diagram in FIG. 1 illustrates that the modular control lines 122 include a SYNC or synchronisation line 124, a SDA or data line 126 (for I2C communication), and a SCL or clock line 128 (for I2C communication).

The synchronisation line 124 is used to send time signals from the central controller 104 to the battery cell modules 102 to allow the battery cell modules 102 to closely synchronise their respective control timing accordingly. In a high frequency control environment, all battery cell modules 102 must operate their respective switching assemblies 112 in a very well-timed manner. Frequently, the timing accuracy requirements are more strict than the tolerance permitted by a standard clock of the cell microcontrollers 108, and a synchronisation signal from the synchronisation line 124 allows the cell modules 102 to operate with higher timing accuracy.

The data line 126 is used to send duty cycle and time shift values from the central controller 104 to the respective battery cell modules 102, and to send the measured voltage and temperature sensor values from the respective battery cell modules 102 to the central controller 104. The duty cycle and time shift values determine how the switching assemblies 112 of each module 102 operates. This is explained in further detail below.

In accordance with 120 communication, the clock signal is used by the cell microcontrollers 108 to decipher data received from the central controller 104.

Alternative hardware configurations for the battery system 100 are described in further detail below with reference to FIGS. 19 to 23.

Figure 4:
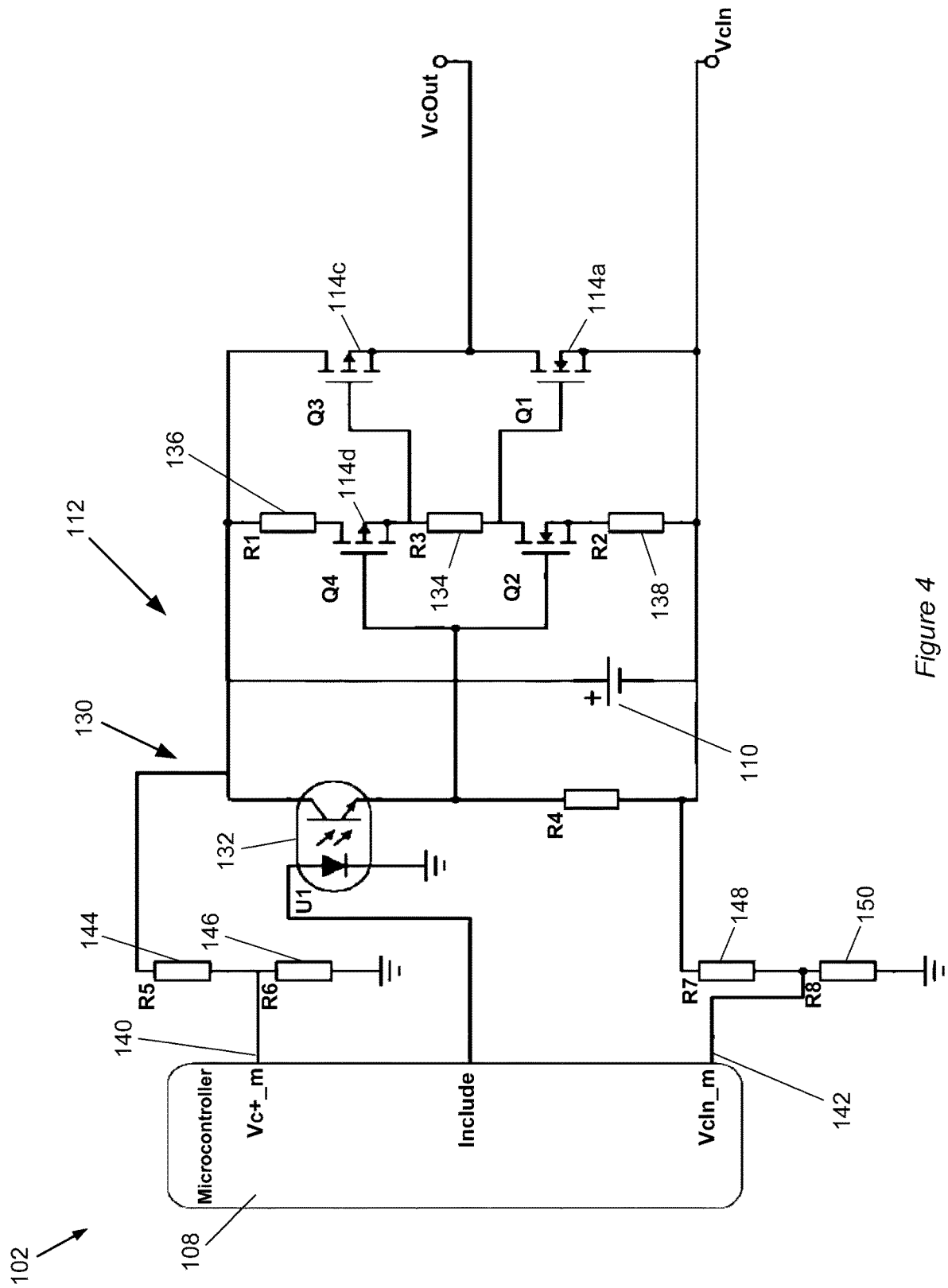
FIG. 4 is a circuit diagram of a battery cell module of the battery system of FIG. 1 according to one embodiment of the invention.

Now turning to FIG. 4, which illustrates a circuit layout of a battery cell module 102 according to one embodiment of the invention. The cell unit includes a cell microcontroller 108, a battery cell unit 110 and a switching assembly 112. The switching assembly 112 includes four transistors 114a, 114b, 114c, 114d and voltage and optionally temperature sensors (not shown). It also includes gate drive circuitry 130, including isolation electronics 132 (e.g. an opto-coupler).

During operation, the cell microcontroller 108 receives sensor inputs of voltage sensor reading, communicates with the central controller 104 and receives control signals based on the sensor readings. The control signals are deciphered by the cell microcontroller 108 and used to drive the gate drive circuitry 130 via the isolation electronics 132. The isolation electronics 132 allow the cell microcontroller 108 (which is electrically coupled to ground and cannot stand high voltages) to interface with the drive circuitry 132 and battery cell unit 110 (which can be at a high voltage in battery packs where many cell units are connected in series).

The gate drive circuitry 132 includes the collection of electronic components through which the cell microcontroller 108 controls the power transistors 114. The drive circuitry 132 converts signals into the appropriate voltages and currents as required to drive the transistors 114 (e.g. MOSFETs typically operate better when they receive a signal that is at a sufficiently high voltage and provides a high current) and to ensure that the transistors 114 are never closed at the same time as this would undesirably short circuit the battery cell unit.

As shown in FIG. 4, the lower power transistor 114a is an NMOS and has the role of disconnecting the cell unit 110 when it conducts. The upper power transistor 114c is a PMOS and has the role of including the cell unit 110 when it conducts. Using one NMOS and one PMOS transistor means that a given input signal (HIGH or LOW) shared across both power transistors 114a, 114c always turns one transistor on and the other off thereby avoiding cell short circuits. When the input signal changes (HIGH to LOW or vice versa), the resistor 134 causes one of the power transistors 114 to receive a control gate current larger than the other, which will cause it to stop conducting before the second starts conducting. In this embodiment, two gate transistors 114b (NMOS) and 114d (PMOS) and associated resistors (136 and 138) are used to take the low-current signal that the isolation electronics 132 provide, and convert it into a signal that can be sufficiently high-current to drive the power transistors 114.

Two nodes 140, 142 and the associated voltage divider resistors 144, 146, 148, 150 are used for voltage measurement. In this embodiment, no effort is made to increase the gate drive voltage of the power transistors 114 higher than the voltage offered by the respective battery cell unit 110. This means that power transistors 114 have to be carefully selected taking this voltage range into account.

The advantages of this embodiment illustrated in FIG. 4 is that it avoids the cost of dedicated driver electronics and a voltage converter. The gate drive circuitry 130 includes a single isolation element, further reducing cost. However, it is recognised that the lack of high power transistor gate voltage limits the selection of power transistors suitable for use. In addition, the gate transistors 114b, 114d are directly powered by the respective battery cell unit 110. In some embodiments, the gate transistors 114b, 114d can be partially powered by the respective battery cell unit 110.

Figure 5:
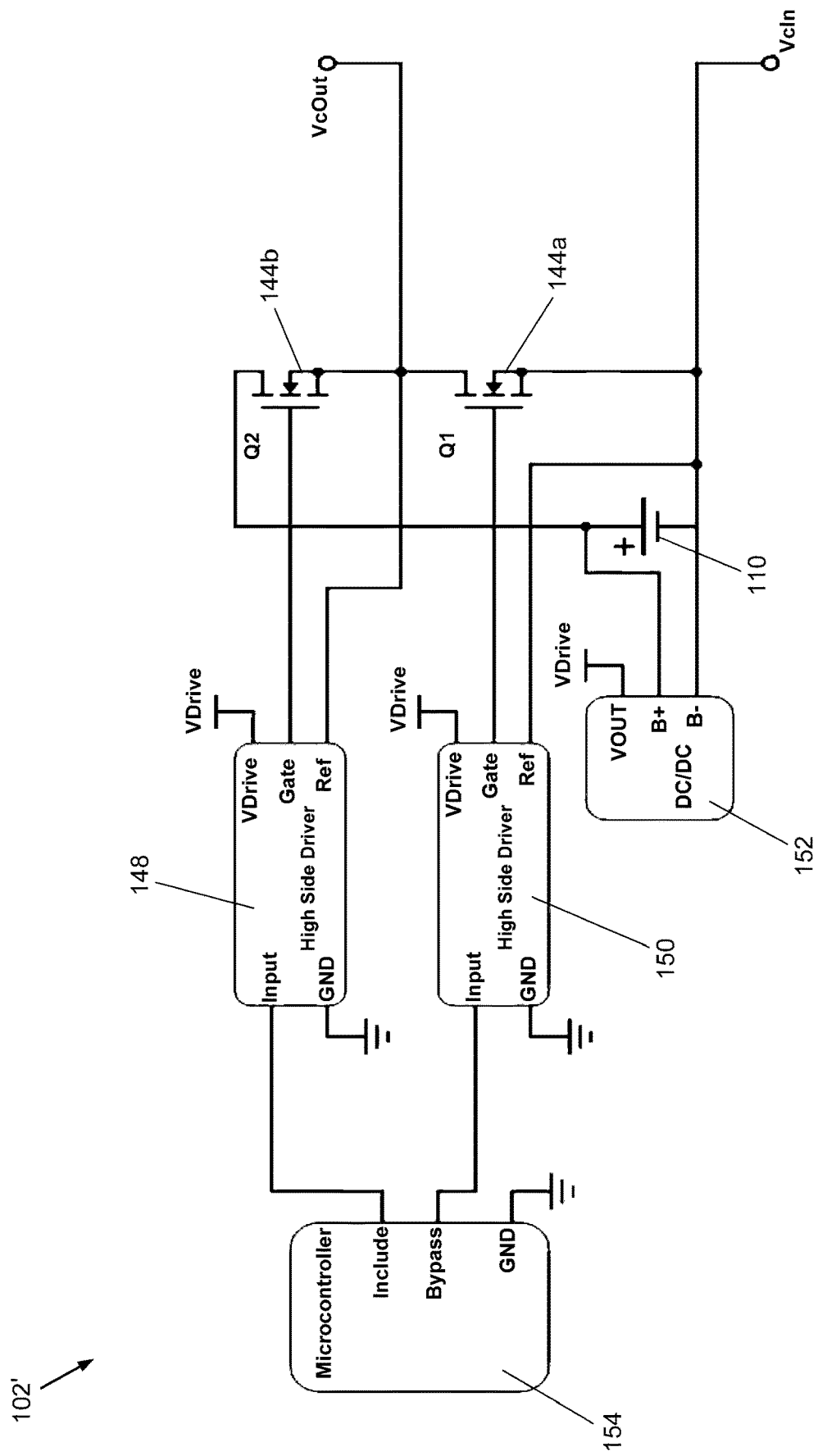
FIG. 5 is a circuit diagram of a battery cell module of the battery system of FIG. 1 according to another embodiment of the invention.

Now referring to FIG. 5, which illustrates a battery cell module 102' according to another embodiment of the invention. Two NMOS power transistors 144a, 144b are used to connect or disconnect the battery cell unit 110, respectively. Each power transistor 144 is connected to dedicated electronic high side driver electronics 148, 150 that isolate the signal and provide a suitably high current capability to drive the transistors 144. An additional DC-DC voltage converter 152 is used to provide the high side driver electronics 148, 150 with a suitably high voltage capability to drive the transistors 144. The DC-DC voltage converter 152 receives its positive and negative power input from the battery cell unit 110. The cell microcontroller 154 controls the two high side driver electronics 148, 150 and acts to ensure one of the power transistors 144 stops conducting before the other commences conducting in order to avoid the possibility of battery cell unit short-circuit. The two high side driver electronics 148, 150 receive their power through the drive voltage input from the DC-DC voltage converter, and therefore indirectly from the battery cell unit 110.

The advantages of this embodiment include its ability to use a wide range of power transistors which have a broad range of gate voltages. However, it is recognised that the embodiment involves increased cost of high side drivers 148, 150 and a voltage converter 152.

Figure 6:
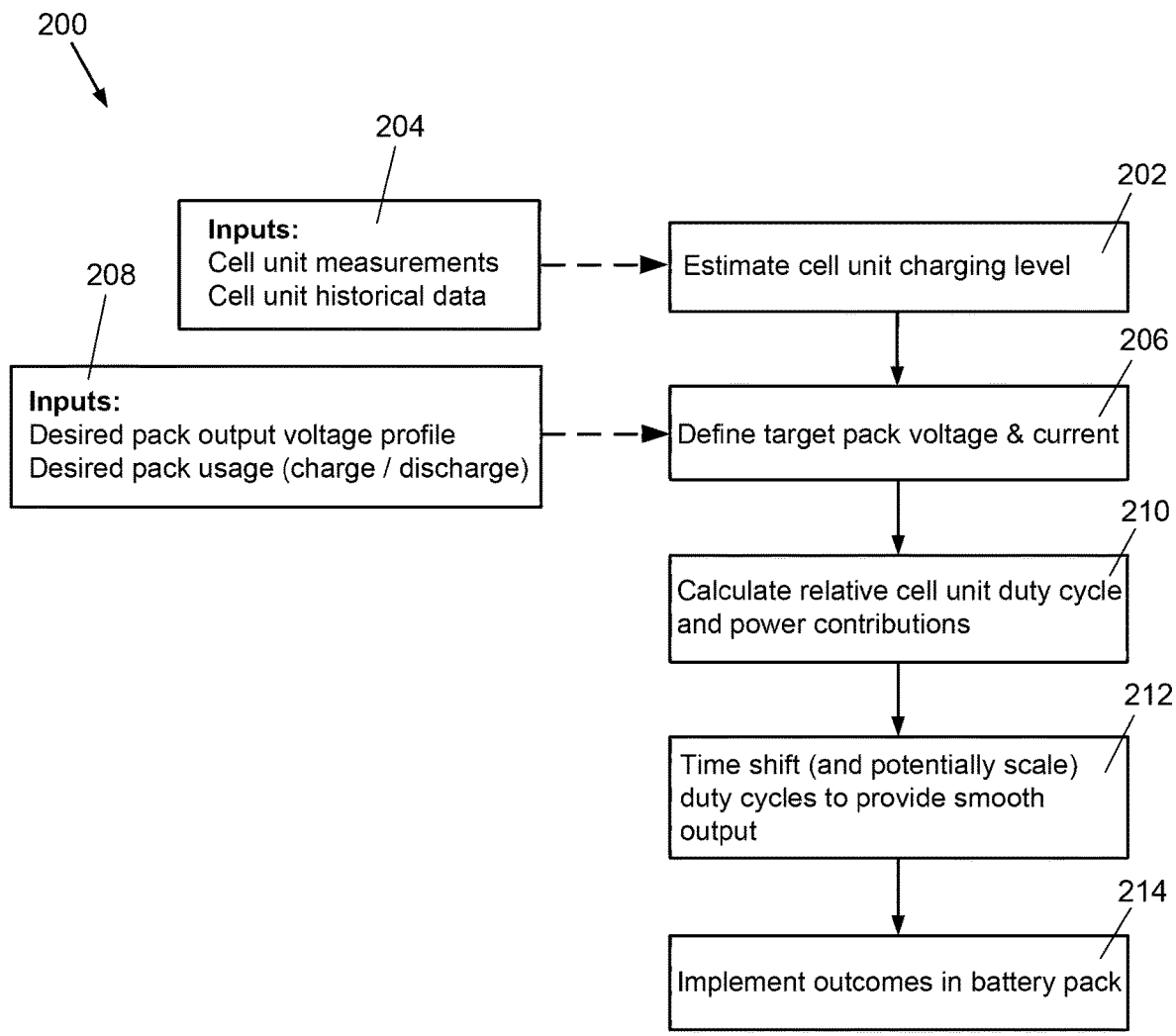
FIG. 6 is a process flow diagram illustrating a method of providing a system voltage output using the battery system of FIG. 1 according to one embodiment of the invention.

Now turning to FIG. 6, which illustrates a method 200 of operating the battery system 100 by determining a set of control parameters including duty cycle and time shift to control the battery cell modules 102.

At step 202, the central controller 104 retrieves input 204 including voltage and potentially current measurements from each battery cell module 102 and estimates the present charge level of each battery cell module 102.

At step 206, the central controller 104 receives input 208 regarding the desired or predetermined output to determine the required or target output for the battery system 100. As discussed, the output may be based on user input values, or the voltage requirements of a device or appliance to be powered by the battery system 100.

The manner in which the central controller 104 calculates the target output and associated total number of cell units to be connected simultaneously will be explained with the example below.

In this example, a battery system has 100 battery cell modules 102 connected in series, each cell module 102 having a battery cell unit 110 capable of providing a voltage of 4.2V when fully charged and 2.7V when fully discharged. In this example, the battery system 100 commenced with all battery cell units 110 fully charged. The battery system is to discharge, while providing a battery system DC output voltage within a narrow range of 260-280V.

In this example, where the battery system output is to be a DC waveform and all battery cell units have the same present voltage, the number of battery cell units to be connected in series simultaneously Z may be calculated using the following formula:

$$Z = \frac{V_{out}}{V_{cell}}$$

wherein,

Z is the number of battery cell units to be connected in series at any given time, $V_{out}$ is the target output voltage of the battery system, and $V_{cell}$ is the voltage of a battery cell unit of the battery system.

Accordingly, to provide a stable output voltage of approximately 270V, 64 batteries are simultaneously connected in series initially (64×4.2V=270V). Throughout discharging, as cell voltages decrease, the controller 104 will gradually increase the number of batteries connected in series simultaneously. Eventually, when the battery cell units 110 are close to fully discharged, all 100 cell units 110 will be connected to provide the output of 270V (100× 2.7V=270V).

Similarly other battery output values can be chosen, with particular suitability if the required voltage is lower than the sum of minimum voltages of all cell units 110 when fully discharged. In these cases, when all cell units 110 have fully discharged, not all cell units 110 are connected to the system 100.

The above formula used in this example to calculate the number of cell units connected simultaneously during discharging, can equally be used to calculate the number of cell units connected simultaneously during charging. In that case, the target output voltage of the battery system is the external charging voltage of the battery.

At step 210, the central controller 104 calculates a duty cycle value for each battery cell unit 110 based on the measured input values 204 retrieved at step 202. The duty cycle defines the amount or proportion of time that a switching assembly 112 connects a respective battery cell unit 110 to the battery system 100 during operation.

At step 212, the central controller 104 calculates a time shift value for each battery cell unit 110, and if required scales the duty cycle values calculated at step 210 based on the input values 204, 208 obtained in steps 202, 206. The time shift is a variable used to control when the duty cycle for a particular battery cell module 102 commences. For instance, for a battery system 100 operating with a 1 Hz system duty cycle frequency and a battery cell module 102 having duty cycle value of 50%, the associated switching assembly 112 may at t=0 connect the associated battery cell unit 110 to the output, and at t=0.5 s disconnect the associated battery cell unit 110. At t=1 s, due to the 1 Hz frequency, the cycle will repeat. However, the battery cell module 102 alternatively be connected at t=0, to be disconnected at t=0.25 s, and again connected at t=0.75 s. Time shifting controls when the connected duty cycle of each battery cell module 102 occurs, to provide the target battery system output.

The manner in which the central controller 104 calculates the duty cycle and time shift for each battery cell module 102 will be explained with the example below.

In this example, the battery system 100 includes 7 battery cell modules 102, which are to be charged. In this example, the target output of the battery system is 3 times the average voltage output of the battery cell units 110. For simplicity, each cell module 102 has a maximum charge capacity it can hold of either 'high' or 'low' as listed in the table below. Each cell module 102 with a 'high' capacity can hold 1.5 Ah of charge, whereas each cell module 102 with a 'low' capacity level can hold 1 Ah of charge. Furthermore, in this example, all battery cells begin in a fully discharged state, and all batteries have the same voltage.

| Cell | Capacity |
|---|---|
| 1 | HIGH |
| 2 | LOW |
| 3 | HIGH |
| 4 | LOW |
| 5 | HIGH |
| 6 | LOW |
| 7 | HIGH |

However, it is to be understood that in practice, the battery system 100 can have many different maximum charge storage capacities, levels of charge to begin with, and voltage levels.

In this example, the central controller calculates the charging duty cycles of cell modules 102 using the following formula:

$$D_{x,charge} = \frac{(Cap_x - C_x) \times Z}{\sum_{\alpha=1}^{N}(Cap_\alpha - C_\alpha) - \sum_{\beta \in Y}(Cap_\beta - C_\beta)}$$

Wherein, $D_{x,charge}$ is the duty cycle for a battery cell unit 'x' during charging, 'Cap' is the total capacity a given battery cell unit 110 can store when fully charged, determined e.g. by on occasion fully charging and fully discharging a battery cell unit, and measuring the amount of charge the battery cell unit was able to provide throughout its transition between states of fully charged and fully discharged, $C_x$ is the current charge level of cell unit 'x', X is a numerical value assigned to battery cell unit 'x' 110 (where each battery cell unit is assigned a number from 1 to N), N is the total number battery cell units 110 in the battery system 100, Y is the collection of the indices 'x' of the specific battery cell units that are disabled from use temporarily or permanently, Z is the number of battery cell units 110 required to be connected at any given time, and α and β are variables used for summation in the equation.

The above formula provides a duty cycle value between 0 and 1 (or 0% and 100%) for each battery cell module 102, denoting the percentage of the time a given battery cell unit 110 is connected to the system 100 via a switching assembly 112.

In the example, based on the duty cycle formula, each cell unit having a 'high' charge receives a duty cycle of 50%, and each cell units having a 'low' charge receives a duty cycle of 33.3%. The sum of all duty cycle values ($D_{total}$) is calculated as follows:

$$D_{total} = \sum_{1}^{N} D = 3 \times 33.3\% + 4 \times 50\% \approx 3$$

Since $D_{total}$ is approximately 3 times a duty cycle of 100%, and therefore matches the number of cells desired in Z, no scaling is required. However, if $D_{total}$ is greater or lower than 300%, the central controller 104 may calculate a scaling factor S to scale the duty cycle values so that a $D_{total}$ of 300% is achieved. The central controller 104 will then control each battery cell module 102 according to the scaled duty cycle values.

As per step 212, the central controller 104 next calculates the shift values for each battery cell unit 110. As discussed, the time shift defines when during a given battery system duty cycle the battery cell unit transitions between being disconnected to connected.

In this embodiment, the first cell unit 110 in-effect has no time shift ($T_1$):

$$T_1=0$$

The time shift for each subsequent cell unit ($T_x$) is the value of the time shift of the previous cell unit 110 ($T_{x-1}$) plus the value of the duty cycle of the previous cell unit 110 ($D_{x-1}$), but no greater than 1:

$$T_x = T_{x-1} + D_{x-1} - \text{floor}(T_{x-1} + D_{x-1})$$

Figure 7:
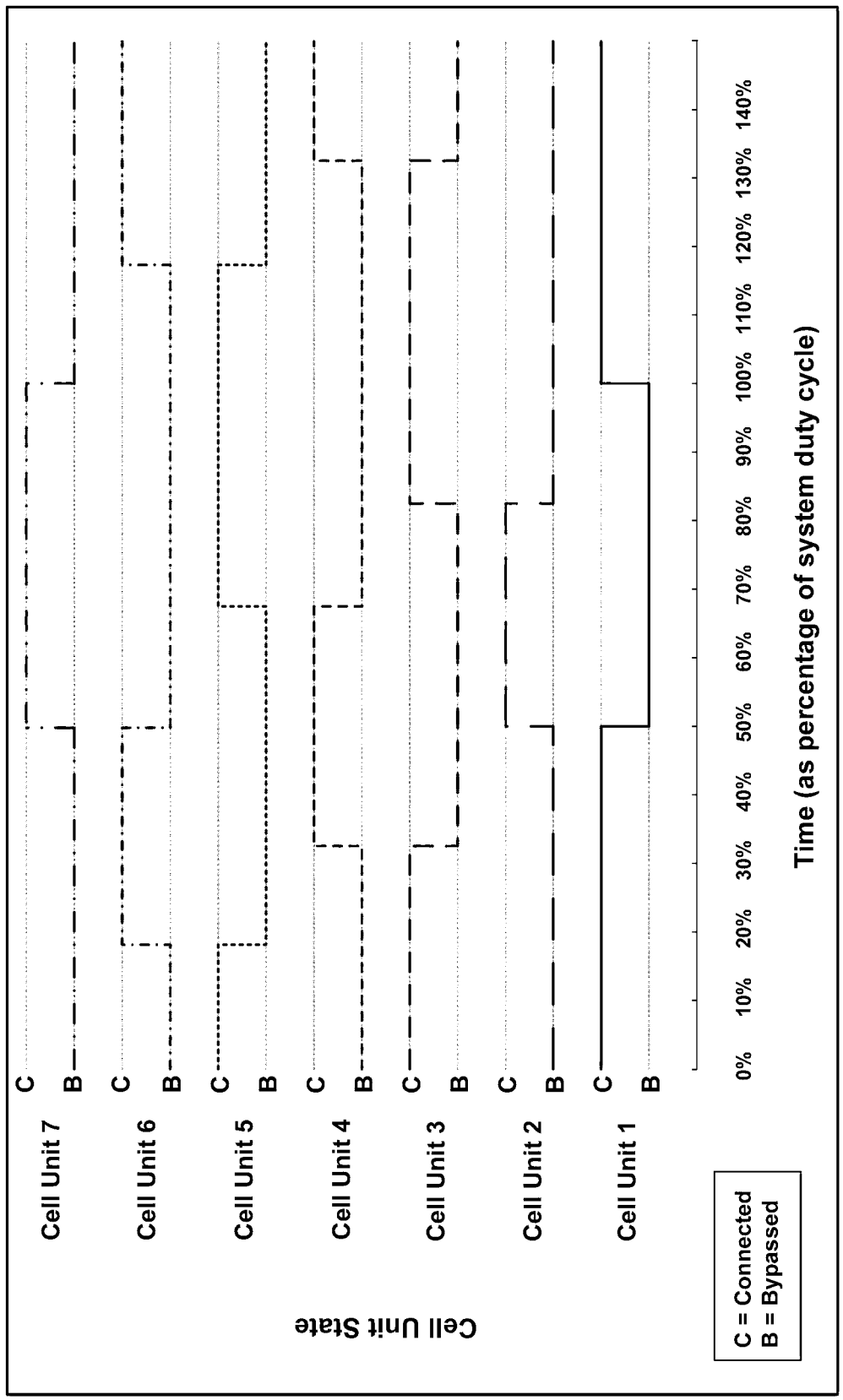
FIG. 7 is a graph illustrating the duty cycle and time shift values over time for the battery cell units of a battery system according to one example embodiment of the invention.

The cell unit behaviour resulting from the above duty cycle and time shift values can be seen in FIG. 7. In this figure, the x-axis denotes time as measured in terms of system duty cycles. In this case, one system duty cycle represents the time in which each cell unit 110 has once been switched on, and once been switched off. The y-axis indicates whether the battery cell unit 110 is connected to the output or disconnected. It can be seen for example that at the start of the system duty cycle (Time=0%), cell units 1, 3, and 5 are connected, and all other cell units are disconnected. At every point in time three cell units are connected, which will provide a total output value of approximately 3 times the average output voltage of each cell unit 110 as desired. Since the cycle is continuously repeating, some cell units including cell unit 3 begin near the end of one duty cycle and continues into the next duty cycle. During operation, cell unit behaviour is repeated over and over again, until new duty cycle values are calculated and assigned by the central controller, thereby causing a change in the switching behaviour of the cell module 102.

In the above example, the central controller 104 can control the battery cell modules 102 to control the total output of the system 100 by choosing the number of cell units to be connected at a specific point in time. Whilst in the above example, three cell units are used at one time, in other examples fewer or more cell units may be used at the same time to provide a higher output voltage.

In an alternative embodiment, the central controller 104 may at step 210 calculate the duty cycle of each battery cell unit 110 based on the following formula.

$$D_x = \frac{V_t - V_{min}}{V_{charge} - V_{min}}$$

wherein, $D_x$ is the duty cycle for a battery cell unit 'x', $V_t$ is the present voltage of a battery cell within the respective battery cell unit 'x', $V_{min}$ is the minimum allowable voltage of the battery cell of battery cell unit 'x' (e.g. when the battery cell is fully discharged), and $V_{charge}$ is the voltage of the battery cell of battery cell unit 'x' when it is fully charged.

As present cell voltage is related to stored charge, the above duty cycle calculation will provide different duty cycles for battery cell units 110 with different amounts of stored charge.

In some embodiments, the central controller 104 may at step 2012 calculate the time shift based on the following formula $$T_x = T_D \times \frac{X - 1}{N}$$

wherein, $T_x$ is the time shift value for battery cell unit 'x', $T_D$ is the period of the duty cycle $$T_D = \frac{1}{f},$$

where f is the control frequency of the battery system,

X is a numerical value assigned to battery cell unit 'x' (where each battery cell is assigned a number from 1 to N), and N is the total number battery cell units in the battery system.

This formula results in the time shift values for the battery cell modules 102 to be evenly spaced values between 0 and $T_D$. The battery cell units 112 will therefore become connected one after the other in a staggered fashion, which for specific duty cycles provides a desirable voltage output profile.

At step 214, the central controller 104 issues control signals to the cell microcontrollers 108 and the output microcontroller 116 to control the operation of each battery cell module 102 and output module 106 in order to provide the desired output to match the values obtained from input 208.

Figure 8:
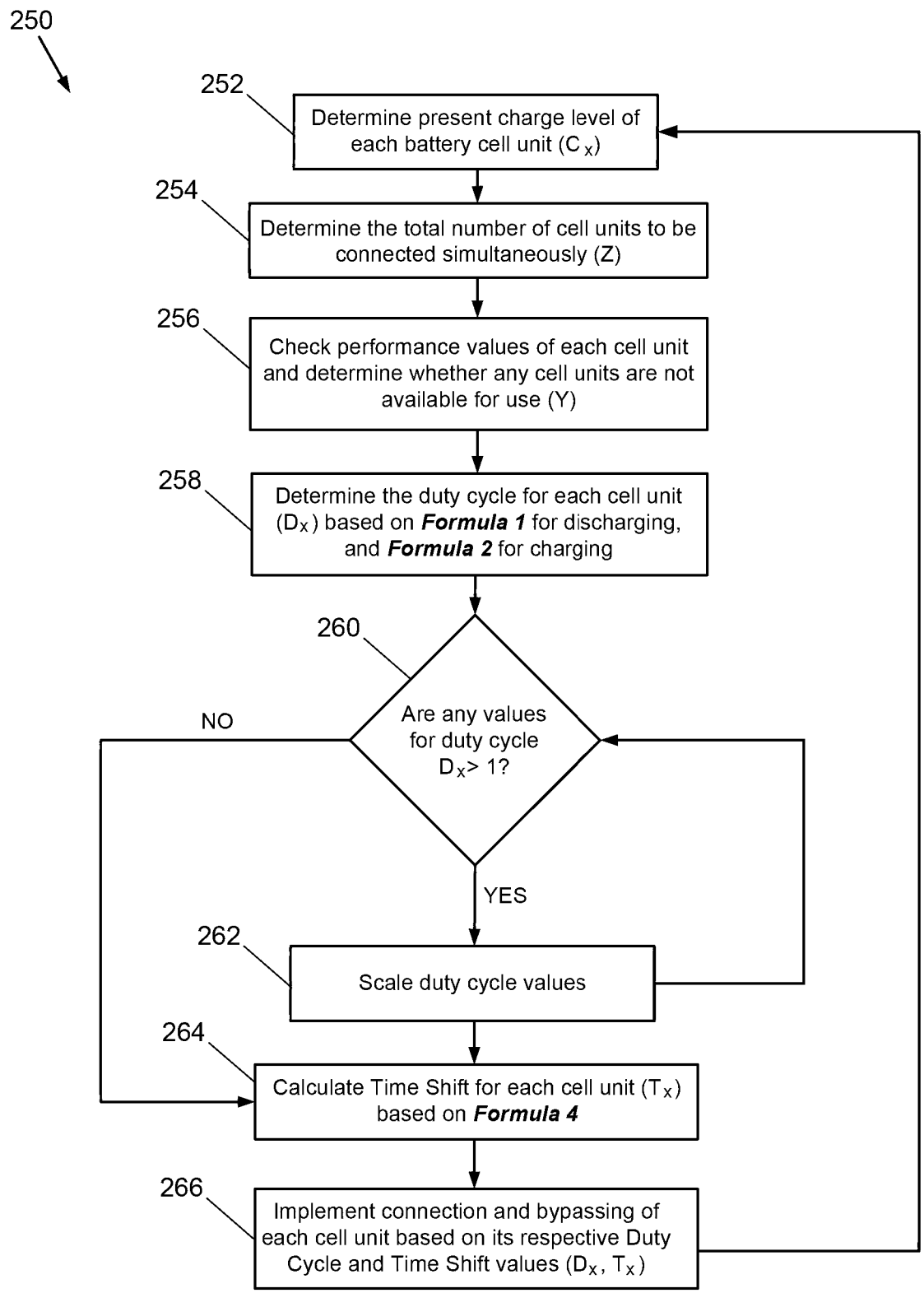
FIG. 8 is a process flow diagram illustrating a method of providing a system voltage output using the battery system of FIG. 1 according to a further embodiment of the invention.

A further method 250 of controlling the battery system 100 to provide the desired voltage output will now be described with reference to FIG. 8.

At step 252, the system 100 determines $C_x$, the charge level presently stored in each battery cell unit 110. This value for $C_x$ is determined, for example, by comparing the measured cell voltage to a lookup table or a function of cell voltage, and considering the remaining capacity relationships under specific conditions including charge and temperature and/or by measuring the amount of charge that has entered and/or left each battery cell over time.

At step 254, the system 100 determines the total number of cell units to be simultaneously connected in order to provide the desired output voltage.

At step 256, the cell microcontroller 108 checks performance parameters of its respective cell unit 110. Some of these performance parameters may include temperature, output voltage, current and the like. In the event that the respective cell unit 110 has a performance parameter outside the norm or a predetermined range, the microcontroller 108 informs the central controller 104 that its respective cell unit 102 is to be disconnected in the present operating cycle. The system 100 marks the disconnected cell units 110 as inactive cell units 110. In a subsequent cycle, if the value of the performance parameters are determined to be within the norm or the predetermined range, the cell microcontroller 108 informs the central controller 104 that the respective cell unit 110 can be connected for use in the present operating cycle. The system 100 marks the connected cell units 110 as active battery cell units 110.

At step 258, the system 100 determines a discharging duty cycle $D_{x,discharge}$ (e.g. when the battery system 100 is providing power to a load and a charging duty cycle $D_{x,charge}$ for each cell unit 110 'x' (e.g. when the battery system 100 is being charged by an external supply) according to the following two formulae:

If the system 100 is providing power to a load and discharging, the duty cycle of a specific cell unit x during the discharge is calculated below:

$$D_{x,discharge} = \frac{C_x \times Z}{\sum_{\alpha=1}^{N} (C_\alpha) - \sum_{\beta \in Y} (C_\beta)} \quad \text{Formula 1}$$

Wherein, $D_{x,discharge}$ is the duty cycle for a battery cell unit 'x' during discharging, $C_x$ is the current charge level of cell unit 'x' [Calculated in step 252].

X is a numerical value assigned to battery cell unit 'x' 110 (where each battery cell unit is assigned a number from 1 to N), and N is the total number battery cell units 110 in the battery system 100.

Y is the collection of the indices 'x' of the specific battery cell units that are disabled from use temporarily or permanently. [Determined in step 256].

Z is the number of battery cell units 110 required to be connected at any given time [Calculated in step 254].

α and β are variables used for summation in the equation. In Formula 1, $\sum_{\alpha=1}^{N} C_\alpha$ is the total capacity present in all battery cells units 110 during discharge is; ($\sum_{\beta \in Y} C_\beta$) is the capacity of all cell units 110 that for any given reason cannot be used, e.g. a cell that has been excluded to keep it in its safe voltage or temperature operating region and/or to protect it from excessive degradation as determined in step 256. The subtraction of the total capacity of cell units 110 which cannot be used from the total capacity of all cell units 110 therefore provides the total capacity of the available cell units 110 ('total available capacity').

Formula 1 then divides the capacity in each cell unit x by the total available capacity—the resulting term $$\left( \frac{C_x}{\sum_{\alpha=1}^{N}(C_\alpha) - \sum_{\beta \in Y}(C_\beta)} \right)$$

specifies how many percent of the total discharge individual cell needs to contribute to an optimal discharge. Finally, converting this into the duty cycle of on-time requires multiplying by the number of cell units 110 that need to be connected in series to provide an acceptable output voltage.

If the system 100 is not providing power to a load and is charging, the duty cycle of a specific cell unit x during charging is calculated below:

$$D_{x,charge} = \frac{(Cap_x - C_x) \times Z}{\sum_{\alpha=1}^{N}(Cap_\alpha - C_\alpha) - \sum_{\beta \in Y}(Cap_\beta - C_\beta)} \quad \text{Formula 2}$$

Wherein,

'Cap' is the total capacity a given battery cell unit 110 can store when fully charged, determined e.g. by on occasion fully charging and fully discharging a battery cell unit, and measuring the amount of charge the battery cell unit was able to provide throughout its transition between states of fully charged and fully discharged.

All other terms have the same meaning as for the discharging equation.

At query step 260, the system 100 determines whether the duty cycle for any of the battery cell units 110 exceed 1 or 100%. If any one or more of the battery cell units 110 in the system 100 have a duty cycle value that exceeds 100%, the method 250 proceeds to step 262. If not, the method 250 proceeds to step 264.

A calculated value for duty cycle can exceed 1, for example, when a discharging battery system comprises one given battery cell unit that holds a significantly higher amount of stored charge than others when discharging. Similarly, this can also occur during charging, when one cell has the same amount of stored charge as others but a significantly higher capacity. In these cases, as it is not possible to operate any battery cell unit 110 at a duty cycle of more than 100%, the system 100 scales up the duty cycle values for the those battery cell units 110 having a duty cycle less than 100% to even out the output requirements for each of the battery cell units 110 so as to achieve an output as close as possible to the desired output. In some cases, this may not be possible, for example, it is not possible to provide an output of 24V with 3 active battery cell units 110 having an output of 6V each. In this case, the system 100 may be instructed to provide the closest possible output, or be turned off.

At step 262, for the duty cycle values of all battery cell units 110, except any battery cell units 110 having a duty cycle of exactly 100%, are scaled according to the formulas below.

For battery cell units 110 having a duty cycle value greater than 100%, the scaled duty cycle value $D_{down}$ is 1, or 100%.

For battery cell units 110 having a duty cycle value less than 100%, the scaled duty cycle value $D_{up}$ is calculates based on Formula 3 below.

$$D_{up} = D_x \times \left( 1 + \frac{\sum_{\alpha \in W}(D_\alpha - 1)}{\sum_{\beta \in V} D_{\beta,x}} \right) \quad \text{Formula 3}$$

Wherein, $D_x$ is the calculated unscaled duty cycle value of each battery cell unit 110, $D_\alpha$ is the calculated unscaled duty cycle value of each of the battery cell units 110 having a duty cycle value exceeding 1, or 100%.

$D_\alpha - 1$ is therefore the amount by which each of these duty cycle values exceed 1 ('duty cycle surplus').

$\Sigma_{\alpha \in W}(D_\alpha - 1)$ is thus the total sum of the duty cycle surplus for all battery cell units 110 having a duty cycle over 1.

W is the collection of the indices 'x' of the specific battery cell units 110 that having an unscaled duty cycle value over 1, and α is a variable used for summation in the equation.

$\Sigma_{\beta \in V} D_{\beta,x}$ is the total sum of duty cycle values of the battery cell units 110 having an unscaled duty cycle value less than 1.

V is the collection of the indices 'x' of the specific active battery cell units 110 having an unscaled duty cycle value less than 1, and α and β are variables used for summation in the equation.

If step 262 causes any battery cell units with a unscaled duty cycle value of less than 1 to exceed 1, scaling step 262 is repeated with all unscaled duty cycles being replaced with the duty cycle values calculated during the previous scaling step. This is done until all scaled duty cycles have a value of 100% or below. If the duty cycle calculation in Formula 3 ever yields a division by zero, this indicates that the output requirements and available battery cells are fundamentally incompatible, at which point the system may transition into a state of partially reduced functionality or fully disconnect the output, depending on user settings.

In step 264, the system 100 calculates a time shift value for each active battery cell unit 110 based on its respective duty cycle value (either scaled or unscaled) as calculated in the previous steps. As noted above, unscaled duty cycle values will be used if none of the duty cycle values calculated in step 258 exceeds 1, otherwise scaled duty cycle values as calculated in step 262 are used.

The first connected cell unit 110 does not have a time shift, so:

$$T = 0$$

The time shift for each subsequent cell unit ($T_x$) is the value of the time shift of the previous cell unit 110 ($T_{x-1}$) plus the value of the duty cycle of the previous cell unit 110 ($D_{x-1}$), but no greater than 1:

$$T_x = T_{x-1} + D_{x-1} - \text{floor}(T_{x-1} + D_{x-1})$$

The inclusion of the floor function term ensures that if $T_{x-1} + D_{x-1}$ is 1 or larger, then 1 is subtracted to return $T_x$ to a fraction equal or larger than 0 and less than 1. If the term inside the floor function is equal or larger than 0 and less than 1, then the floor function returns a value of 0 and does not contribute to the time shift calculation. The result is that the active battery cell units 110 are connected and disconnected in a staggered manner to provide an output profile that equals to or closely matches the desired output profile.

At step 266, the central controller 104 issues control signals to the cell microcontrollers 108 and the output microcontroller 116 to control the operation of each battery cell module 102 and output module 106 in order to provide the desired output.

In the configuration shown in FIG. 1, the steps of the method 250 are predominately carried out by the central controller 104. Each cell microcontroller 108 communicates the corresponding values for each cell unit 110 to the central controller 104, and deciphers the relevant duty cycle and time shift values corresponding to its respective cell unit 110 from the central controller 104 and uses those values to control the respective switching assembly 114 to either disconnect or connect the respective cell unit 110 at the appropriate time. However, in other configurations, the above method steps can be carried out in any one or more of the cell microcontrollers 108 if a central controller 104 is not used.

An example of method 250 will now be explained below with reference to FIGS. 8 to 11.

Assume a battery pack consists of six battery cell units with x=1 to 6 that have respective capacities of 2, 3, 4, 4, 5, and 6 Ah, and where each battery cell unit provides an output voltage of approximately 4V when fully charged, 3.5V when it is half-charged and 3V when discharged. This battery pack starts fully charged and is to be first discharged and then charged while providing an output voltage ranging between 10.5-14V. At the start of discharge all unit are functional, so there are no cells with indices Y. When it commences discharging, the system calculates that to provide a voltage in the output voltage range, three battery cells are desired to be used simultaneously—since 4V/cell*3 cells=12 V. The resulting duty cycles for the cells can be calculated as follows:

$$D_{1,discharge} = \min\left(\frac{2Ah}{(2+3+4+4+5+6)} \times 3, 100\%\right) = 25\%$$

$$D_{2,discharge} = \min\left(\frac{3Ah}{24Ah} \times 3, 100\%\right) = 37.5\%$$

$$D_{3,discharge} = \min\left(\frac{4Ah}{24Ah} \times 3, 100\%\right) = 50\%$$

$$D_{4,discharge} = \min\left(\frac{4Ah}{24Ah} \times 3, 100\%\right) = 50\%$$

$$D_{5,discharge} = \min\left(\frac{5Ah}{24Ah} \times 3, 100\%\right) = 62.5\%$$

$$D_{6,discharge} = \min\left(\frac{6Ah}{24Ah} \times 3, 100\%\right) = 75\%$$

Figure 9:
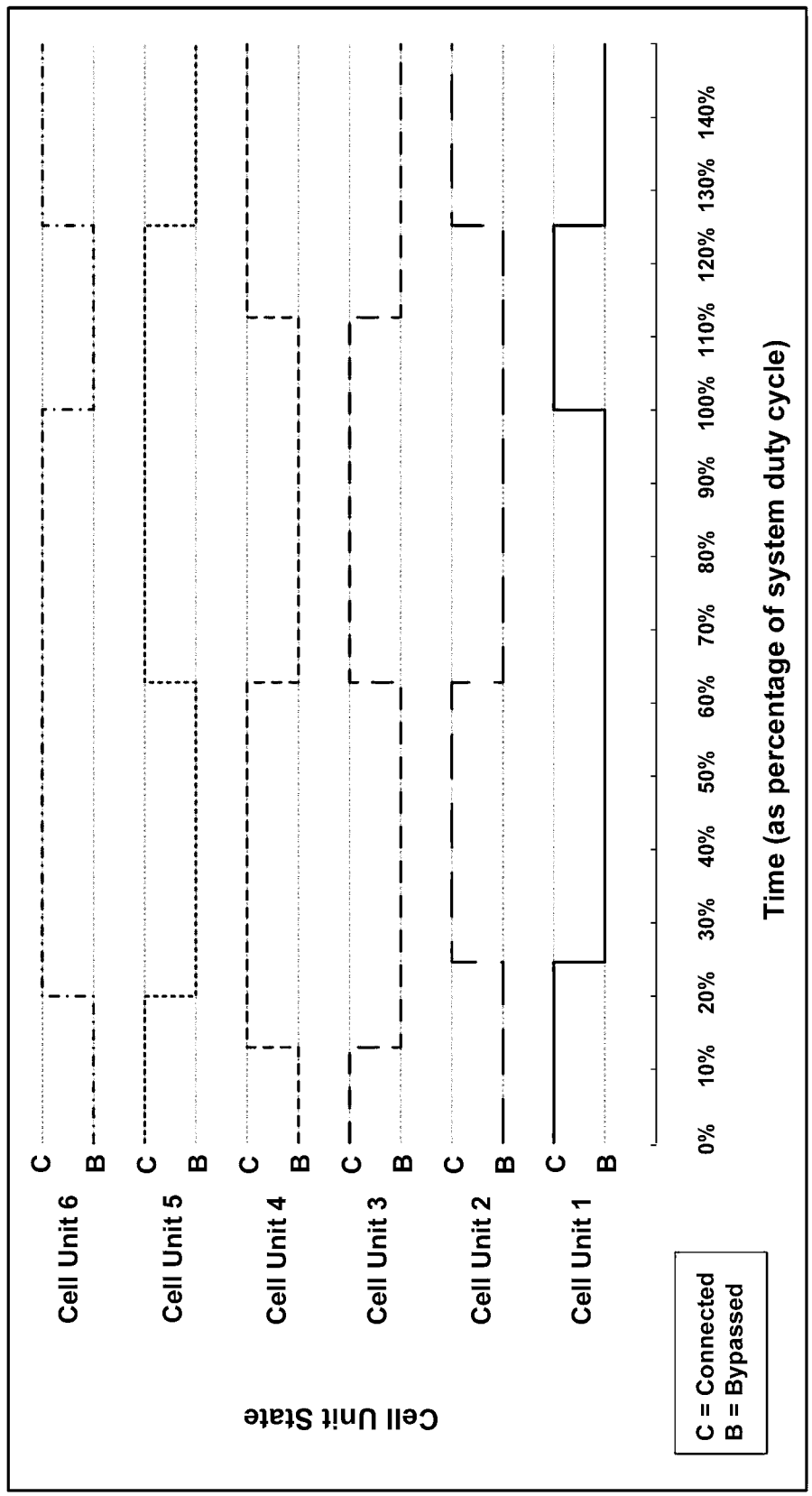
FIG. 9 is a process flow diagram illustrating a method of providing a system voltage output using the battery system of FIG. 1 according to one embodiment of the invention.

Based on the time shift formulas and processes provided previously, the cell unit time shifts can be calculated as follows:

$T_1=0$ $T_2=T_1+D_1-\text{floor}(T_1+D_1)=0+25\%-\text{floor}(25\%)=25\%$ $T_3=25\%+37.5\%-\text{floor}(62.5\%)=62.5\%$ $T_4=62.5\%+50\%-\text{floor}(62.5\%+50\%)=112.5\%-1=12.5\%$ $T_5=12.5\%+50\%-\text{floor}(62.5\%)=62.5\%$ $T_6=62.5\%+62.5\%-\text{floor}(62.5\%+62.5\%)=125\%-1=25\%$ The cell unit behaviour resulting from the above duty cycle and time shift values can be seen in FIG. 9. It can be seen that cell unit 2 becomes connected when cell unit 1 becomes disconnected. The result as can be seen on the right is a system having 4 cell units connected at all points in time.

By the time the battery cells are half-discharged, cell units x=1 to 6 have respective remaining stored charge of 1, 1.5, 2, 2, 2.5 and 3 Ah. At this point, the voltage of the pack has reached 3.5 V/cell*3 cells=10.5V. Since discharging the pack further would lead the battery output voltage to drop below 10.5V, the system calculates that for continued discharging using four cells simultaneously is now desirable since 3.5V/cell*4 cells=14V, i.e. the high end of the desired voltage range with room for the pack voltage to reduce as the pack continues to discharge. The duty cycles immediately before this change to four cells for cells 1, 4 and 6 can be calculated to be identical as above:

$$D_{1,discharge} = \min\left(\frac{1Ah}{(1+1.5+2+2+2.5+3)} \times 3, 100\%\right) = 25\%$$

$$D_{2,discharge} = \min\left(\frac{1.5Ah}{12Ah} \times 3, 1\right) = 37.5\%$$

$$D_{3,discharge} = \min\left(\frac{2Ah}{12Ah} \times 3, 1\right) = 50\%$$

$$D_{4,discharge} = \min\left(\frac{2Ah}{12Ah} \times 3, 1\right) = 50\%$$

$$D_{5,discharge} = \min\left(\frac{2.5Ah}{12Ah} \times 3, 1\right) = 62.5\%$$

$$D_{6,discharge} = \min\left(\frac{3Ah}{12Ah} \times 3, 1\right) = 75\%$$

Similarly, the time shift values prior to the change remain identical at:

$T_1=0$ $T_2=T_1+D_1-\text{floor}(T_1+D_1)=0+25\%-\text{floor}(25\%)=25\%$ $T_3=25\%+37.5\%-\text{floor}(62.5\%)=62.5\%$ $T_4=62.5\%+50\%-\text{floor}(62.5\%+50\%)=112.5\%-1=12.5\%$ $T_5=12.5\%+50\%-\text{floor}(62.5\%)=62.5\%$ $T_6=62.5\%+62.5\%-\text{floor}(62.5\%+62.5\%)=125\%-1=25\%$ The duty cycles immediately after this change can be calculated as follows:

$$D_{1,discharge} = \min\left(\frac{1Ah}{(1+1.5+2+2+2.5+3)} \times 4, 100\%\right) = 33.3\%$$

$$D_{2,discharge} = \min\left(\frac{1.5Ah}{12Ah} \times 4, 1\right) = 50\%$$

$$D_{3,discharge} = \min\left(\frac{2Ah}{12Ah} \times 4, 1\right) = 66.7\%$$

$$D_{4,discharge} = \min\left(\frac{2Ah}{12Ah} \times 4, 1\right) = 66.7\%$$

$$D_{5,discharge} = \min\left(\frac{2.5Ah}{12Ah} \times 4, 1\right) = 83.3\%$$

$$D_{6,discharge} = \min\left(\frac{3Ah}{12Ah} \times 4, 1\right) = 100\%$$

Figure 10:
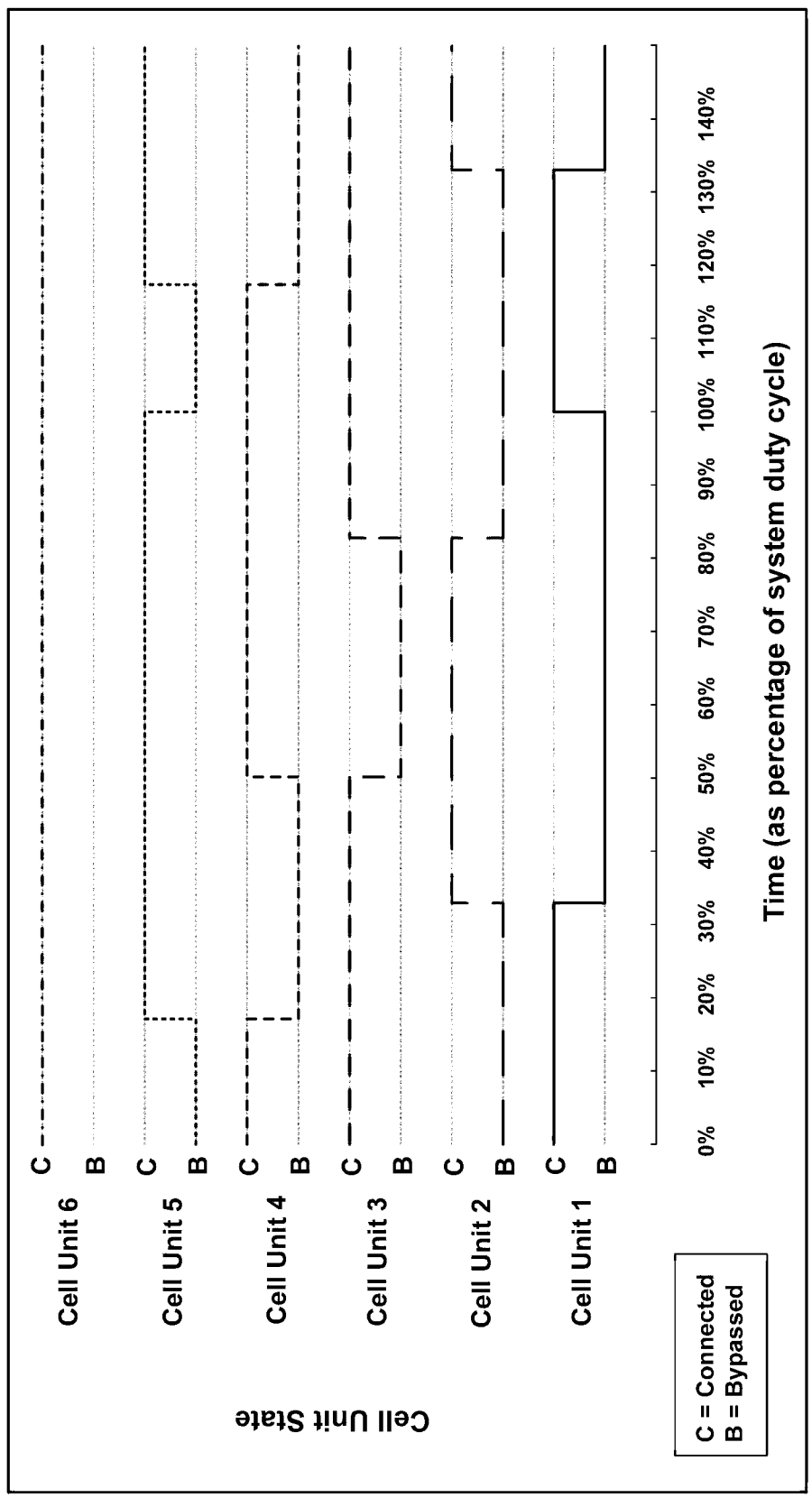
FIG. 10 is a graph illustrating the duty cycle and time shift values over time for the battery cell units of a battery system according to a further example embodiment of the invention.

The corresponding time shifts can be calculated as follows:

$T_1 = 0$ $T_2 = 33.3\% - \text{floor}(33.3\%) = 33.3\%$ $T_3 = 33.3\% + 50\% - \text{floor}(33.3\% + 50\%) = 83.3\%$ $T_4 = 83.3\% + 66.7\% - \text{floor}(83.3\% + 66.7\%) = 150\% - 1 = 50\%$ $T_5 = 50\% + 66.7\% - \text{floor}(50\% + 66.7\%) = 116.7\% - 1 = 16.7\%$ $T_6 = 16.7\% + 83.3\% - \text{floor}(16.7\% + 83.3\%) = 100\% - 1 = 0\%$ The cell unit behaviour resulting from the above duty cycle and time shift values can be seen in FIG. 10.

Suppose further that immediately after this change, the system determines based on present temperature or voltage measurements that cell unit 3 ought to be disconnected temporarily for the purpose of prolonging its operational lifespan. In this case, the duty cycles change as follows:

$$D_{1,discharge} = \min\left(\frac{1Ah}{(1+1.5+2+2+2.5+3)} \times 4, 1\right) = 40\%$$

$$D_{2,discharge} = \min\left(\frac{1.5Ah}{10Ah} \times 4, 1\right) = 60\%$$

$$D_{4,discharge} = \min\left(\frac{2Ah}{10Ah} \times 4, 1\right) = 80\%$$

$$D_{5,discharge} = \min\left(\frac{2.5Ah}{10Ah} \times 4, 1\right) = 100\%$$

$$D_{6,discharge} = \min\left(\frac{3Ah}{10Ah} \times 4, 1\right) = \min(120\%, 100\%) = 100\%$$

Cell unit 3 is disconnected temporarily, which means it has a duty cycle of 0.

As mentioned previously, the duty cycle of any given cell cannot exceed 100%. Since the duty cycle for cell 6 would exceed this amount without its cap, scaling is brought into play. It can be seen that in the above example, no longer provide 4 cells in series at any point in time, since the sum of duty cycles of connected cells is 40%+60%+80%+100%+100%=3.8, i.e. no longer 4 as would be required for 4 simultaneous cells in series throughout operation.

As per the scaling formula given previously, every cell with a capacity of <100% is recalculated. Therefore the new duty cycles for cells 1, 2 and 4 become:

$$D_{1,discharge} = 40\% \times \left(1 + \frac{20\%}{40\% + 60\% + 80\%}\right) = 44.4\%$$

$$D_{2,discharge} = 60\% \times \left(1 + \frac{20\%}{40\% + 60\% + 80\%}\right) = 66.7\%$$

$$D_{4,discharge} = 80\% \times \left(1 + \frac{20\%}{40\% + 60\% + 80\%}\right) = 88.9\%$$

Following this scaling, the total sum of duty cycles can be calculated as 44.4%+66.7%+88.9%+100%+100%=4. As such, the resulting system operation is capable of providing 4 series cells to be connected simultaneously as required.

Figure 11:
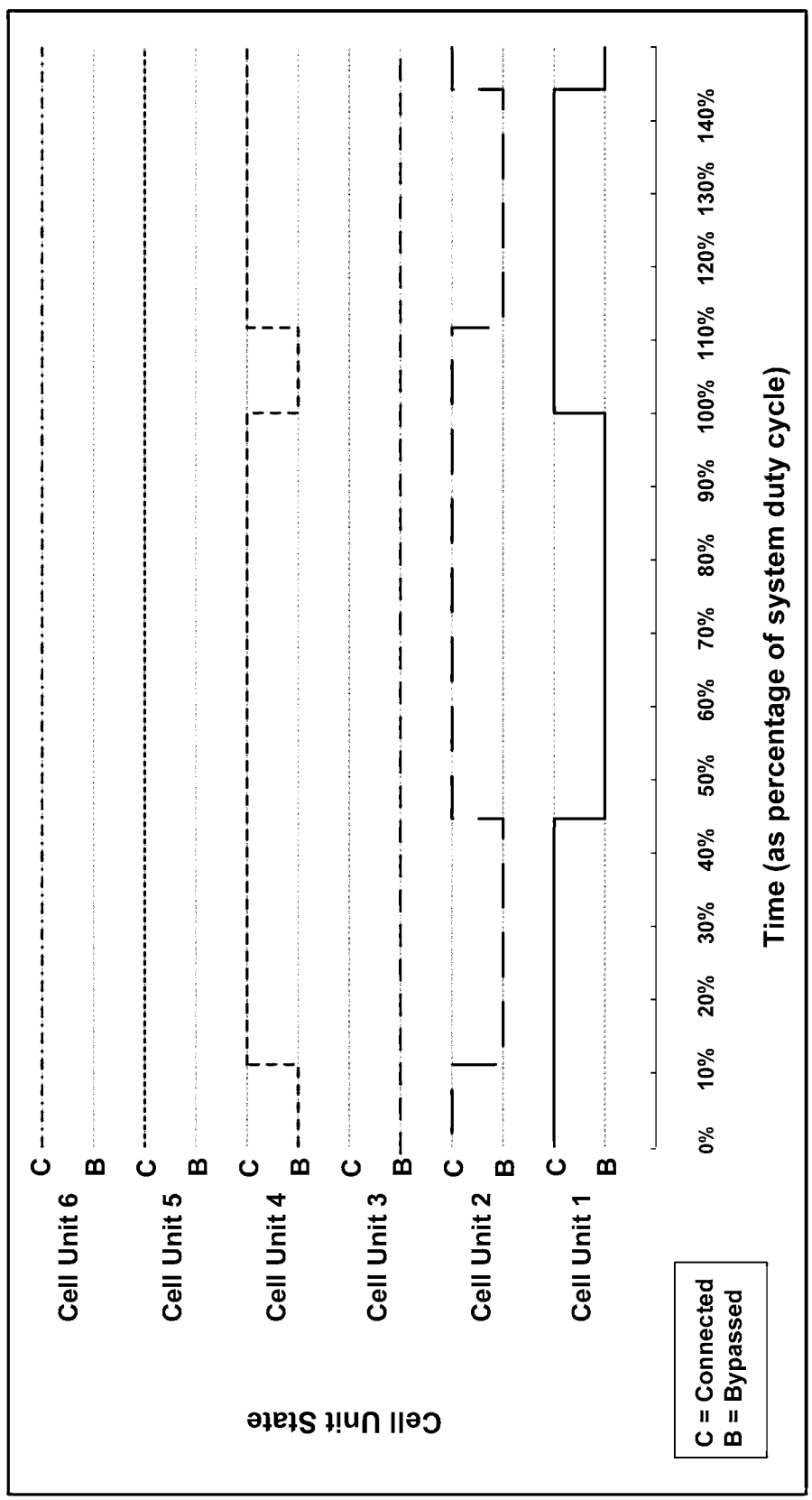
FIG. 11 is a graph illustrating the duty cycle and time shift values over time for the battery cell units of a battery system according to a further example embodiment of the invention.

The corresponding time shift values can be calculated as follows:

$T_1 = 0$ $T_2 = 44.4\% - \text{floor}(44.4\%) = 44.4\%$ $T_3 = 44.4\% + 66.7\% - \text{floor}(44.4\% + 66.7\%) = 111.1\% - 1 = 11.1\%$ $T_4 = 11.1\% + 0\% - \text{floor}(11.1\% + 0\%) = 11.1\%$ $T_5 = 11.1\% + 88.9\% - \text{floor}(11.1\% + 88.9\%) = 100\% - 1 = 0\%$ $T_6 = 0\% + 100\% - \text{floor}(100\%) = 100\% - 1 = 0\%$ The cell unit behaviour resulting from the above duty cycle and time shift values can be seen in FIG. 11.

The above examples illustrate how the system can produce DC output voltage profiles, but the battery system 100 may similarly be capable of producing other output waveforms. By selecting the output to be a rectified sine waveform, this may simplify conversion to an AC output. The battery system 100 may also be able to switch between different output waveforms based on user input or as is required by devices connected to the output.

To provide AC output, the central controller 104 determines the number of battery cell units 110 to be connected at any given time to provide an output voltage fluctuation at a certain frequency (e.g. 50 or 60 Hz as used by domestic households). For example, a battery system including 100 battery cell modules 102 can be controlled so that the system alternates between having no battery cell units 110 connected (output=0V), having an increasing number of batteries connected, until a total output voltage of a given level, e.g. 270V, is reached, before then reducing again and going to zero. By doing so in a timely manner, a rectified sine wave can be produced. The advantage of a rectified sine wave is that using a relatively simple and standard set of electronic switches, such as an H-bridge, this output can be converted into a positive-negative oscillating 50/60 Hz signal. Optionally, a standard AC transformer can additionally be used to increase or decrease the AC signal to a required level (e.g. output voltage can be reduced to 230V).

Figure 12:
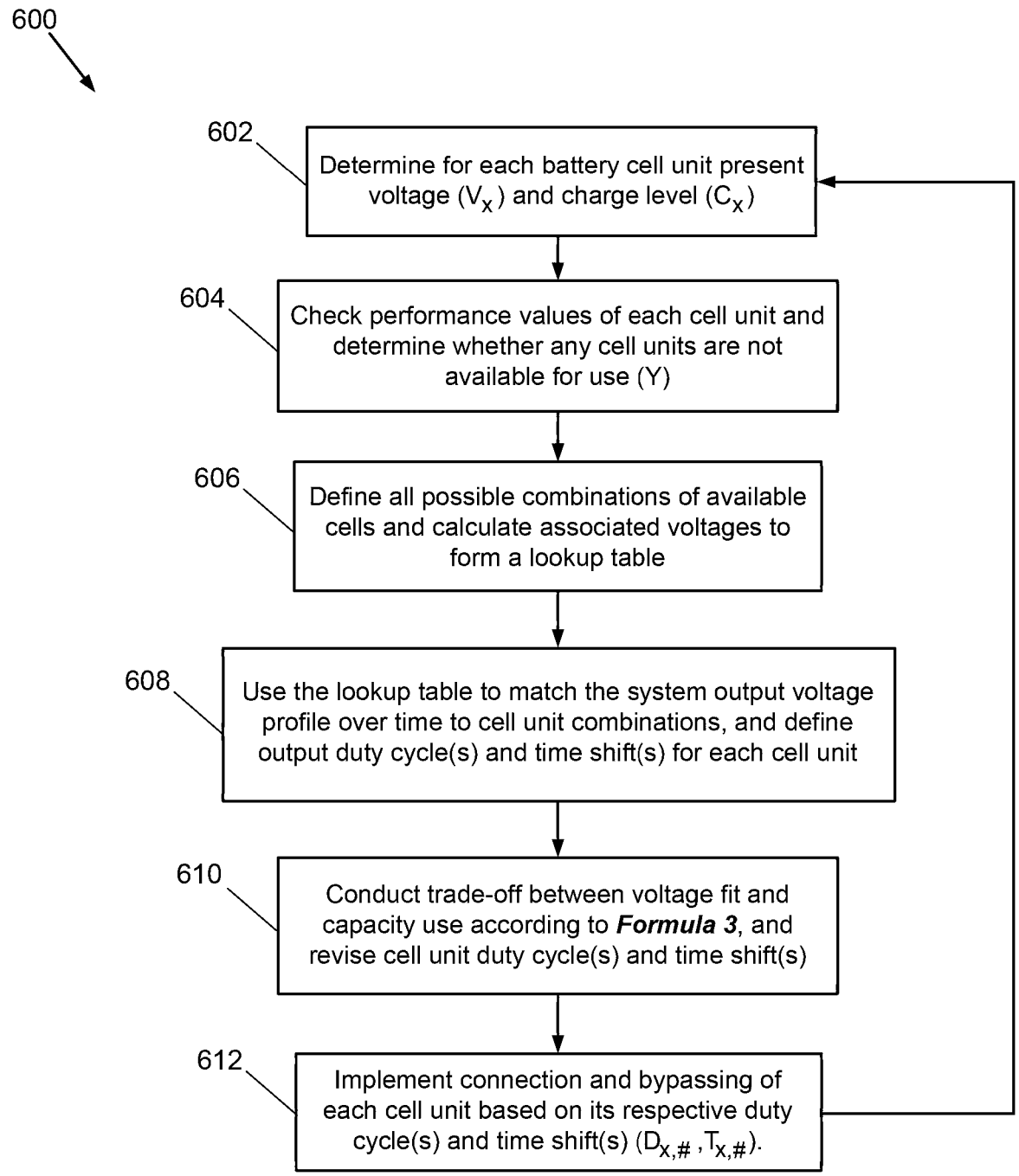
FIG. 12 is a process flow diagram illustrating a method of providing a system voltage output using the battery system of FIG. 1 according to an embodiment of the invention.

A further method 600 of controlling the battery system 100 to provide a desirable voltage output will now be described with reference to FIG. 12.

At step 602, the system 100 determines $V_x$, the voltage of each battery cell unit 110, and $C_x$, the charge level presently stored in each battery cell unit 110. This value for $C_x$ is determined, for example, by comparing the measured cell voltage to a lookup table or a function of cell voltage, and considering the remaining capacity relationships under specific conditions including charge and temperature and/or by measuring the amount of charge that has entered and/or left each battery cell over time.

At step 604, the cell microcontroller 108 checks performance parameters of its respective cell unit 110. Some of these performance parameters may include temperature, output voltage, current and the like. In the event that the respective cell unit 110 has a performance parameter outside the norm or a predetermined range, the microcontroller 108 informs the central controller 104 that its respective cell unit 102 is to be disconnected in the present operating cycle. The system 100 marks the disconnected cell units 110 as inactive cell units 110. In a subsequent cycle, if the value of the performance parameters are determined to be within the norm or the predetermined range, the cell microcontroller 108 informs the central controller 104 that the respective cell unit 110 can be connected for use in the present operating cycle. The system 100 marks the connected cell units 110 as active battery cell units 110.

At step 606, the system 100 computes all possible combinations of cell units 110 available for use and calculates the associated combined voltages. The combination voltage is the sum of cell unit voltages for all cell units that are part of the combination. The system 100 then forms a lookup table containing all available cell unit combinations, and combination voltages.

In an example, the battery system 100 contains 5 battery cell units 110, each with a charge capacity, stored charge and voltage as listed in the table below.

|  | Cell Unit (#) | | | | |
| --- | --- | --- | --- | --- | --- |
|  | 1 | 2 | 3 | 4 | 5 |
| Cell Capacity (Ah) | 5 | 2.85 | 1.66 | 1.25 | 1 |
| Cell Stored Charge (Ah) | 1 | 1 | 1 | 1 | 1 |
| Cell Unit Voltage (V) | 2.4 | 2.7 | 3.2 | 3.6 | 4.0 |

A select subset of the multitude combinations defined and combination voltages that can be calculated is provided below.

| Cell Unit (#) Combination | None | 1 | 2 | 3 | 4 | 5 | 1 + 2 | 1 + 3 | 2 + 3 | 1 + 4 | 2 + 4 | 1 + 5 |
| --- | --- | --- | --- | --- | --- | --- | --- | --- | --- | --- | --- | --- |
| Combination Voltage (V) | 0 | 2.4 | 2.7 | 3.2 | 3.6 | 4 | 5.1 | 5.6 | 5.9 | 6 | 6.3 | 6.4 |

At step 608, the system 100 uses the lookup table to match the predetermined or desired system output voltage to combinations of cell units. The system 100 then uses this lookup table to define one or more duty cycles and time delays for each cell unit 110.

Figure 13:
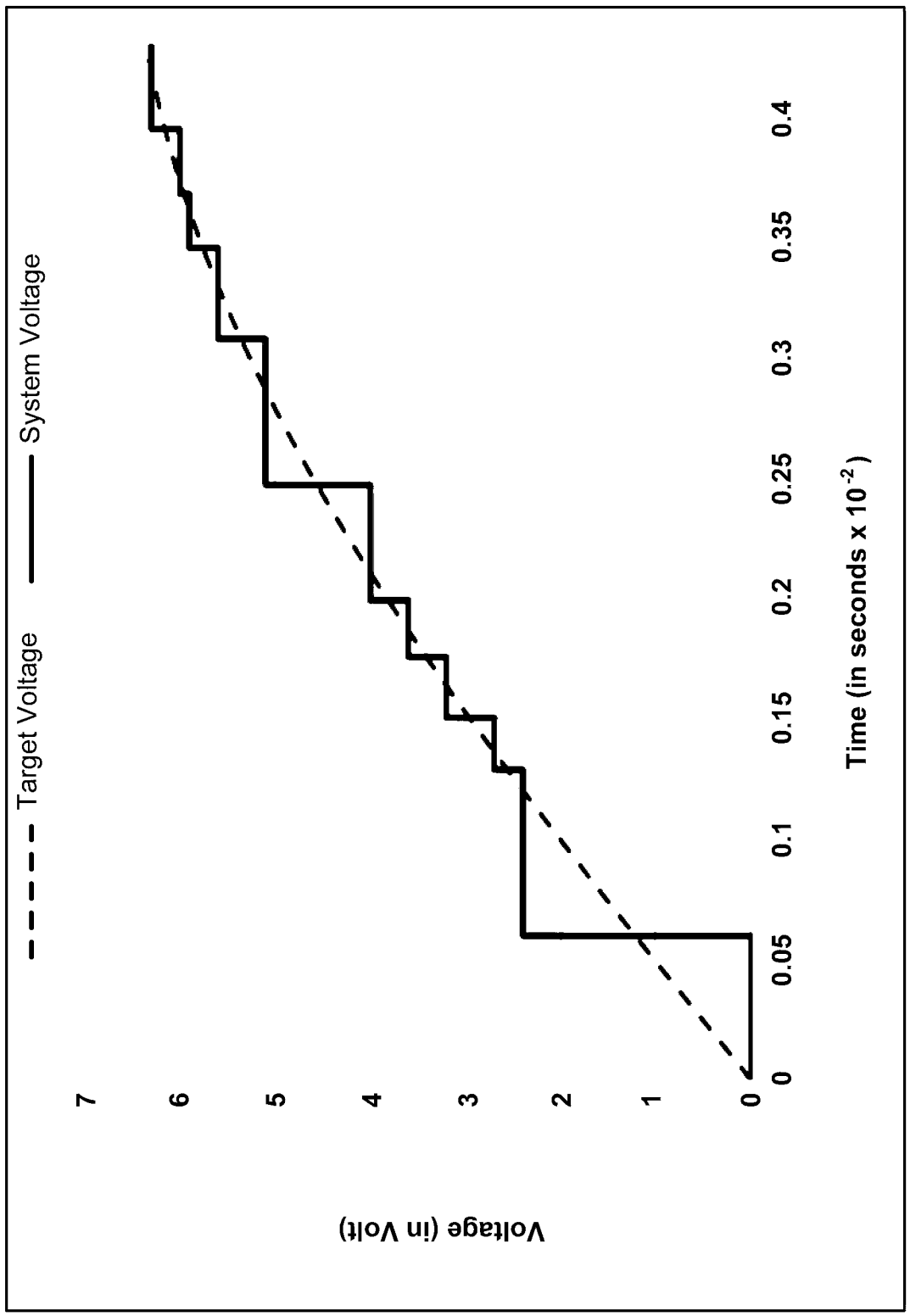
FIG. 13 is a graph illustrating the output voltage of a battery system over time of a battery system according to one example embodiment of the invention compared to a target voltage.
Figure 14:
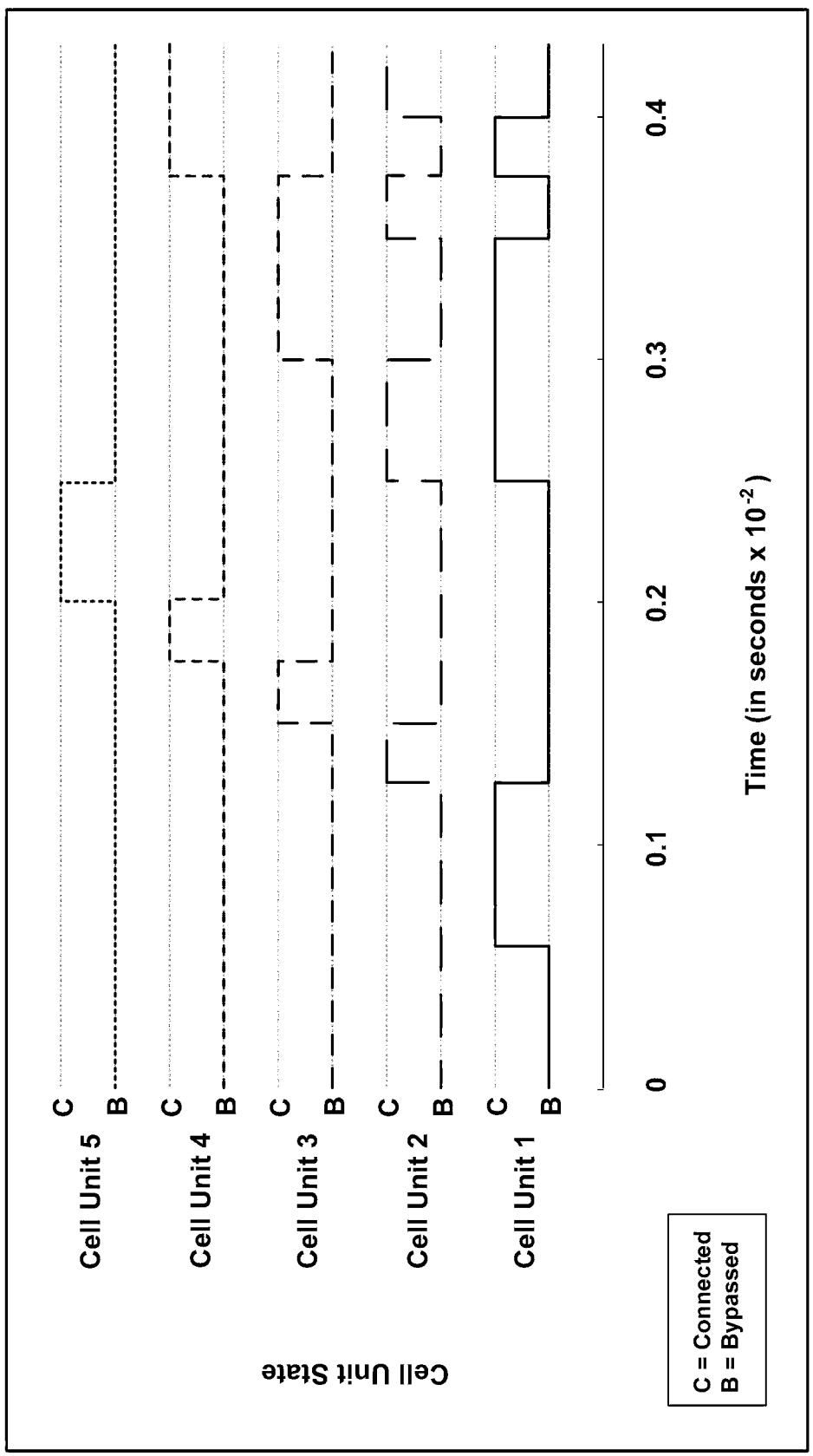
FIG. 14 is a graph illustrating the duty cycle and time shift values over time for the battery cell units of a battery system according to a further example embodiment of the invention.

In the example above, the desired system output voltage, may be the non-linear, sinusoidal target voltage illustrated in FIG. 13. The system proceeds to match to this profile the respective combinations that are closest in terms of voltage and defines the duty cycles and time delays as necessary to achieve the best fit. In some embodiments, the system may, during periods of mismatch between the system target and combination voltage (e.g. in the example for $t<0.05\times10^{-2}$ seconds), additionally use pulse-width modulation approaches to further improve voltage fit. The cell unit behaviour resulting from the associated duty cycle and time shift values can be seen in FIG. 14. The system voltage resulting from the associated duty cycle and time shift values can be seen in FIG. 13.

At step 610, the battery system conducts a trade-off process between the best target voltage fit and the optimal use of cell capacity. Assuming the example above and that battery pack is to discharge, the process examines all sets of two cells according to the following mathematical inequality.

$$\frac{C_{T,bypassed}}{C_{T,connected}} > 1 + F \times |V_{T,connected} - V_{T,bypassed}| \quad \text{Formula 3}$$

Wherein, $C_{x,used}$ is the charge stored in a first battery cell unit 110 that is intended to be connected at a time T defined by a specific duty cycle and time shift, $C_{y,unused}$ the charge stored in a second battery cell unit 110 that is intended to be disconnected at time T, F is a trade-off factor with a value larger than zero that defines the importance of providing an system output voltage that is close to the desired output voltage as compared to the importance of maximising the capacity accessible in the battery pack, $V_{T,used}$ is the voltage of a first battery cell unit 110 that is intended to be connected at the time T, and $V_{T,unused}$ is the voltage of a first battery cell unit 110 that is intended to be disconnected at the time T.

If the above inequality is found to be true for a given set of cell units, then the cell unit 110 intended to be disconnected at a given time T, is to be connected at that time, whereas the cell intended to be connected at that time is to be disconnected at that time. This formula effectively ensures that if one cell unit with a larger stored charge is intended to be disconnected, while another with a lower stored charge is to be connected, but their voltages are not excessively dissimilar, then they switch roles so the cell unit with the larger remaining capacity can contribute more to the output. Since in the specific example above all cell units have the same stored charge, for any set of two cell units, the inequality does not hold and a trade-off does not take place.

At step 612, the central controller 104 issues control signals to the cell microcontrollers 108 and the output microcontroller 116 to control the operation of each battery cell module 102 and output module 106 in order to provide the desired output.

Figure 15:
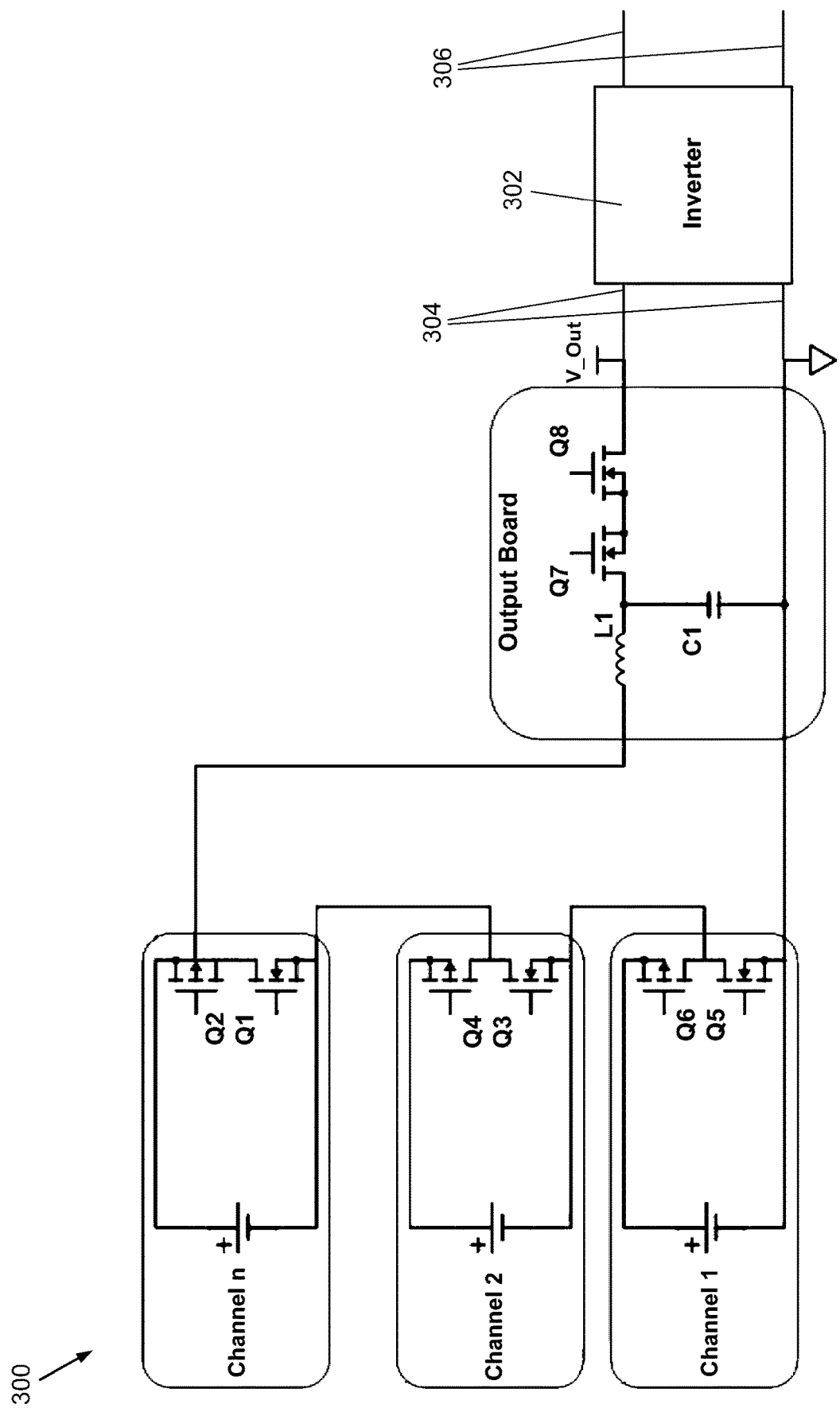
FIG. 15 is a schematic circuit diagram illustrating an output configuration of the battery system according to one embodiment of the invention.

Now turning to FIG. 15, which shows a battery system 300 which incorporates the components of battery system 100, and further including an inverter 302. The inverter 302 converts the DC voltage output from terminals 304 (generated as described above) and converts the DC signal into an AC signal at output terminals 306.

Figure 16:
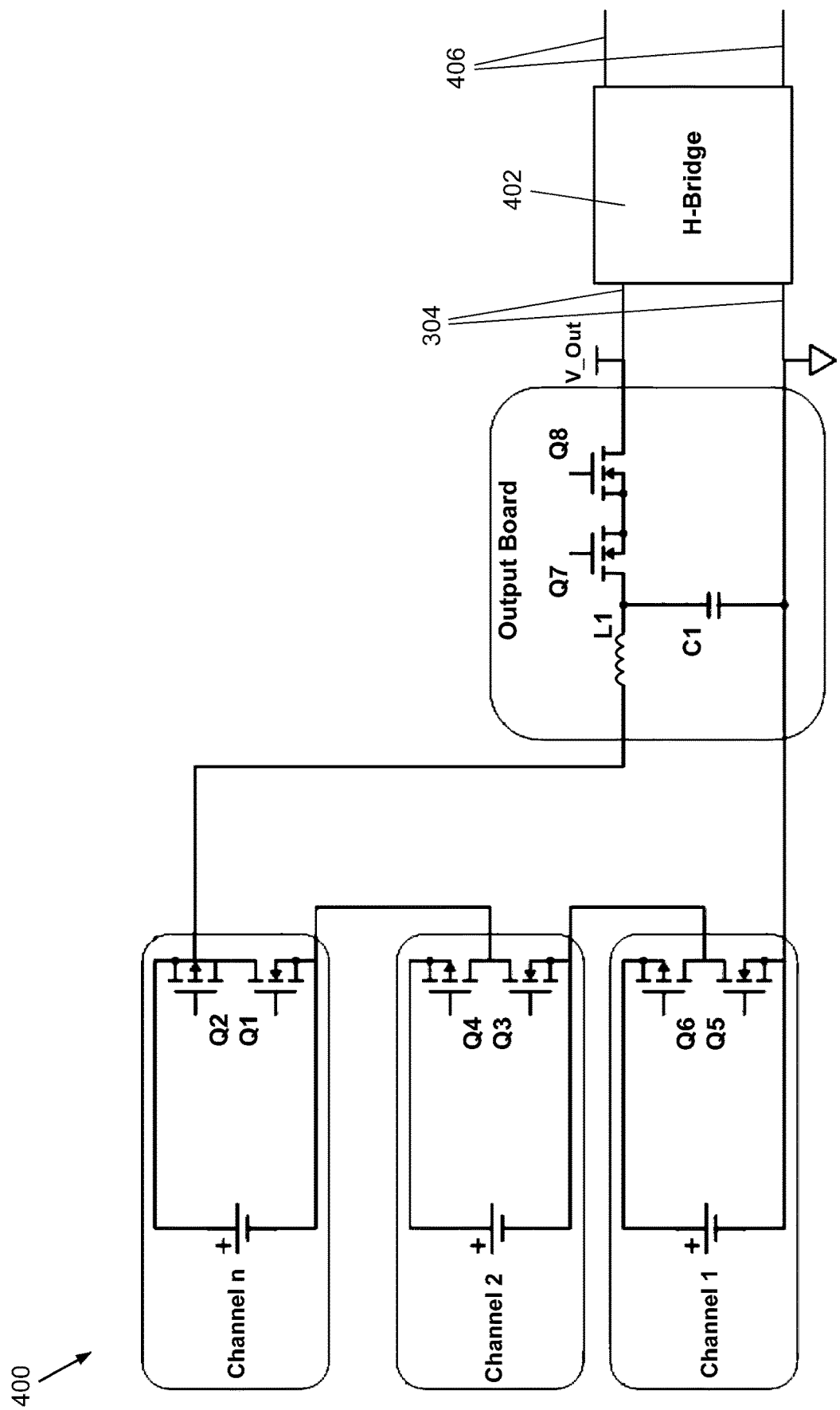
FIG. 16 is a schematic circuit diagram illustrating an output configuration of the battery system according to another embodiment of the invention.

FIG. 16 illustrates an embodiment of a battery system 400 which incorporates the components of battery system 100, and further including an H-bridge 402. The battery system 400 can provide a 'one-sided' signal such as a rectified sine-wave output at terminals 304 as previously described, and the H-bridge 402 converts the waveform to provide positive-negative oscillations at output terminals 406.

Figure 17:
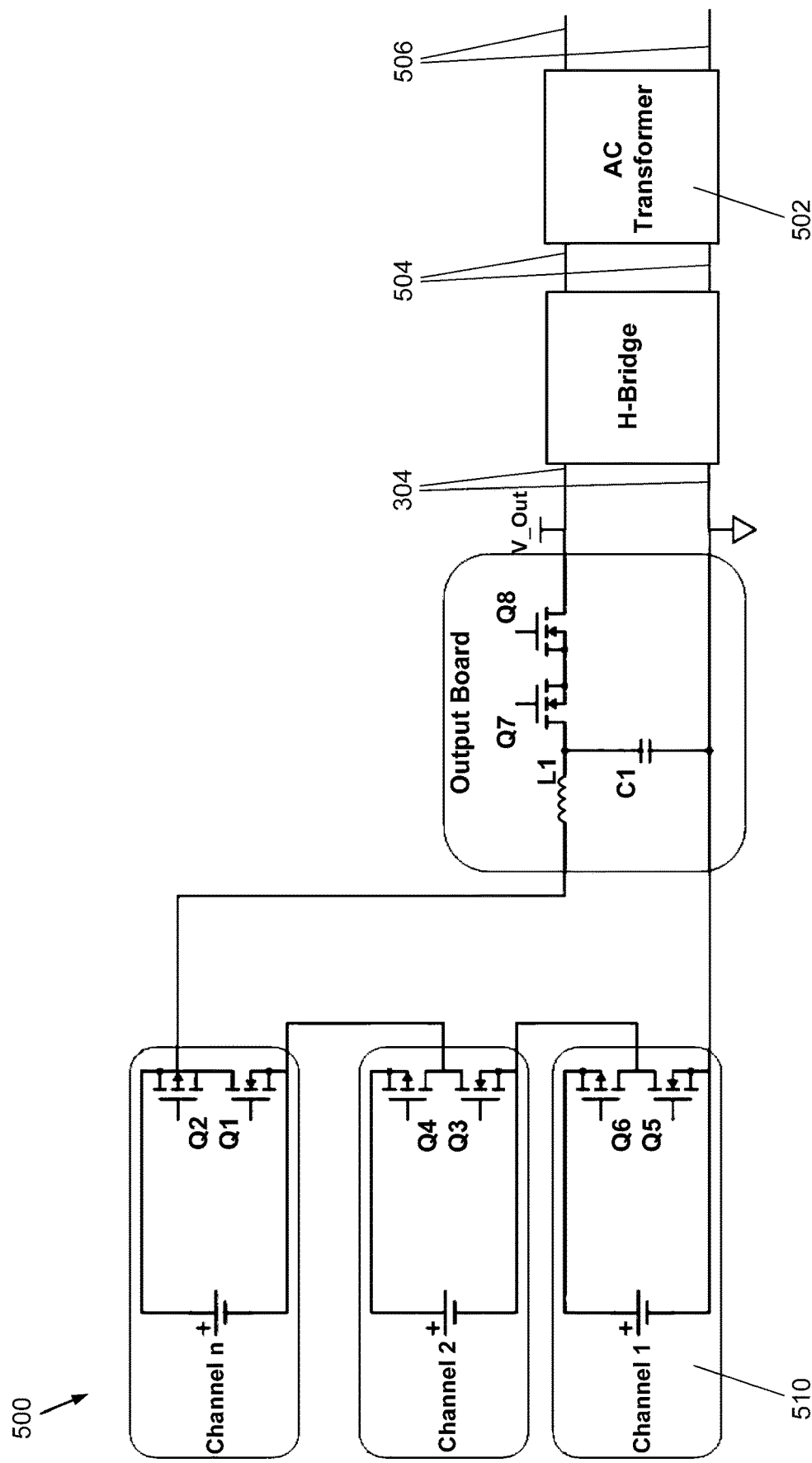
FIG. 17 is a schematic circuit diagram illustrating an output configuration of the battery system according to a further embodiment of the invention.

FIG. 17 illustrates a further embodiment of a battery system 500 which incorporates the components of battery system 400, and further including a transformer 502. Similar to FIG. 9, output terminals 504 provide an output signal with an oscillating positive-negative waveform. The transformer 502 is capable of stepping up or down the output signal to a certain required level. The system 500 can be used in certain applications if the number of battery cell units 510 in the system 500 do not permit an output voltage at the target level. For instance, if the system 500 only included 10 battery cell units 510 each providing 4.2V when fully charged, the transformer 502, if operating as a step-up transformer, allows the system 500 to provide a total output voltage greater than 42V (10*4.2V).

Figure 18:
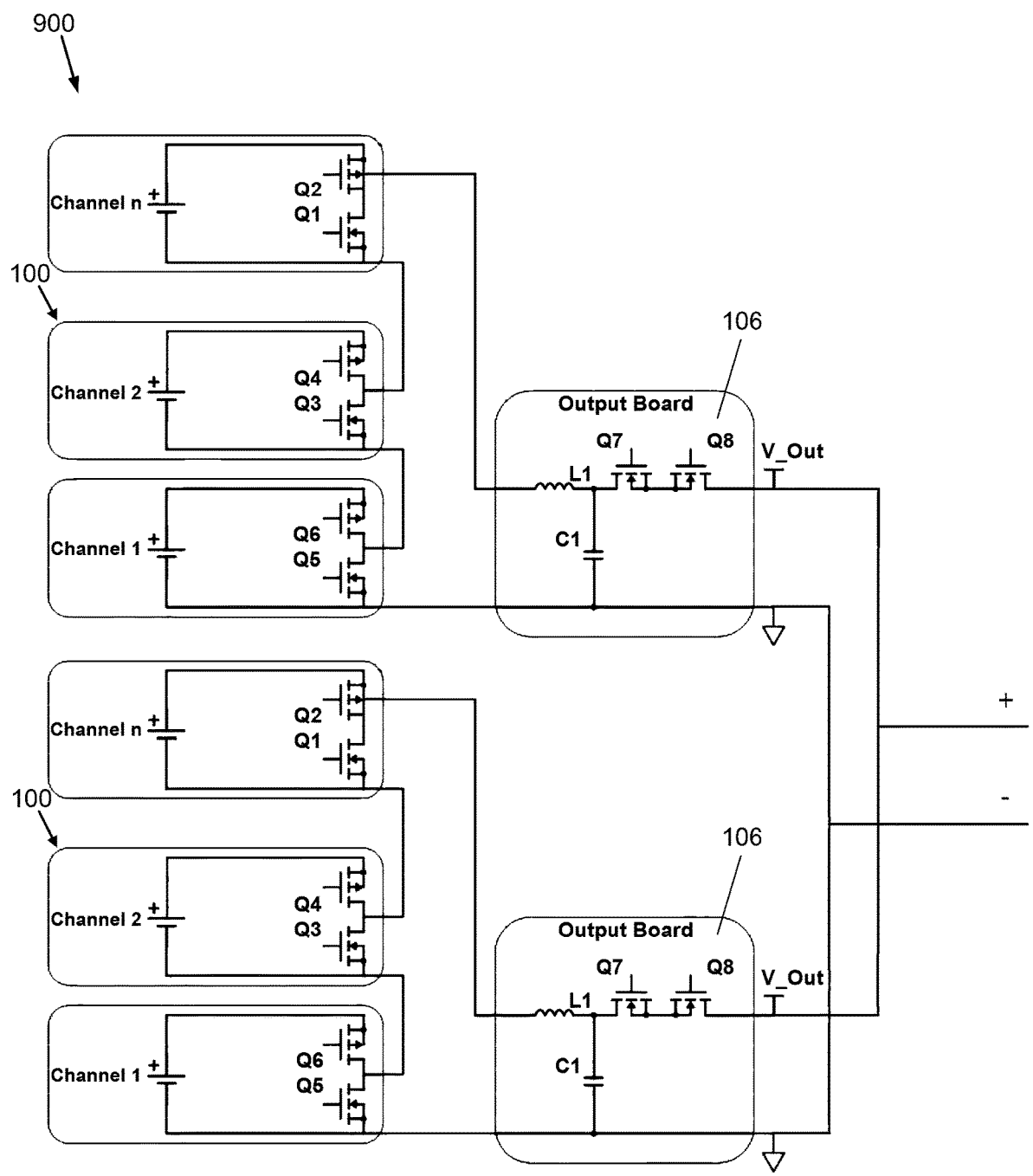
FIG. 18 is a schematic circuit diagram illustrating the configuration of a battery system arrangement including two battery systems connected in parallel according to a further embodiment of the invention.

FIG. 18 illustrates a battery system 900 according to a further embodiment in which two battery systems 100 are connected in parallel. As output voltage from battery systems 100 can be controlled in the manner previously described, the output current from each system 100 can also be similarly controlled by controlling the relative voltage of the two battery systems 100. The level of output control for each of the systems 100 allow the systems 100 to be compatible for parallel connection in the manner illustrated in FIG. 11. Whilst FIG. 11 illustrates that each system 100 includes a corresponding output module 106, it will be understood that the two systems 100 can also share a single output module 106 in some applications.

In a standard battery pack system, paralleling DC terminals can be problematic as different battery pack have different capacities, and more energy may be drawn from one pack than another. As a result, DC-DC converters are often required on the output terminals of each pack prior to the parallel connection, in order to decouple the pack voltages from one another and allow a level of control, thereby adding costs.

In some cases, it is possible to connect a battery system 100 according to one embodiment of the invention to a standard or conventional battery system. Typically paralleling two battery packs of different chemistries and types can be problematic since the batteries in each system each follow a different voltage profile. However, using a battery system 100, it is possible to configure the battery system 100 to match the voltage profile of the standard or conventional battery pack system for parallel connection.

Figure 19:
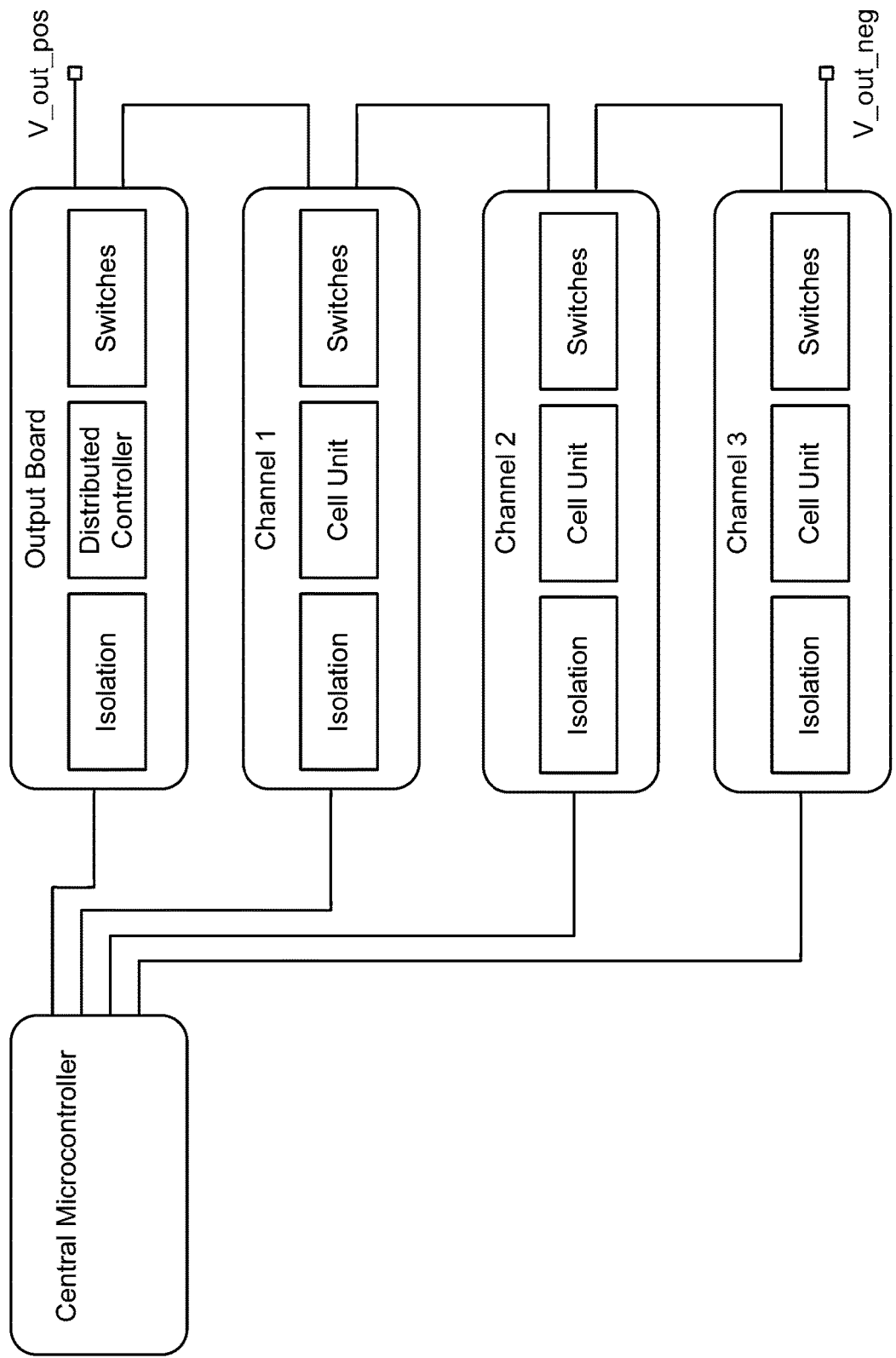
FIG. 19 is a schematic diagram illustrating a centralized configuration for the battery system according to one embodiment of the invention.

FIG. 19 illustrates a battery system according to a further embodiment in which the central microcontroller has dedicated communication lines with each distributed controller. In this embodiment, only the output module contains a distributed controller, while the switching assemblies receive control signals via dedicated lines from the central microcontroller without local processing other than electrical isolation. This embodiment has the advantage of reduced controller cost by avoiding a need for a distributed controller associated with cell unit switching assemblies, but has the disadvantage of dedicated signal lines to each switching assembly, which may increase system layout complexity and reduce reliability.

Figure 20:
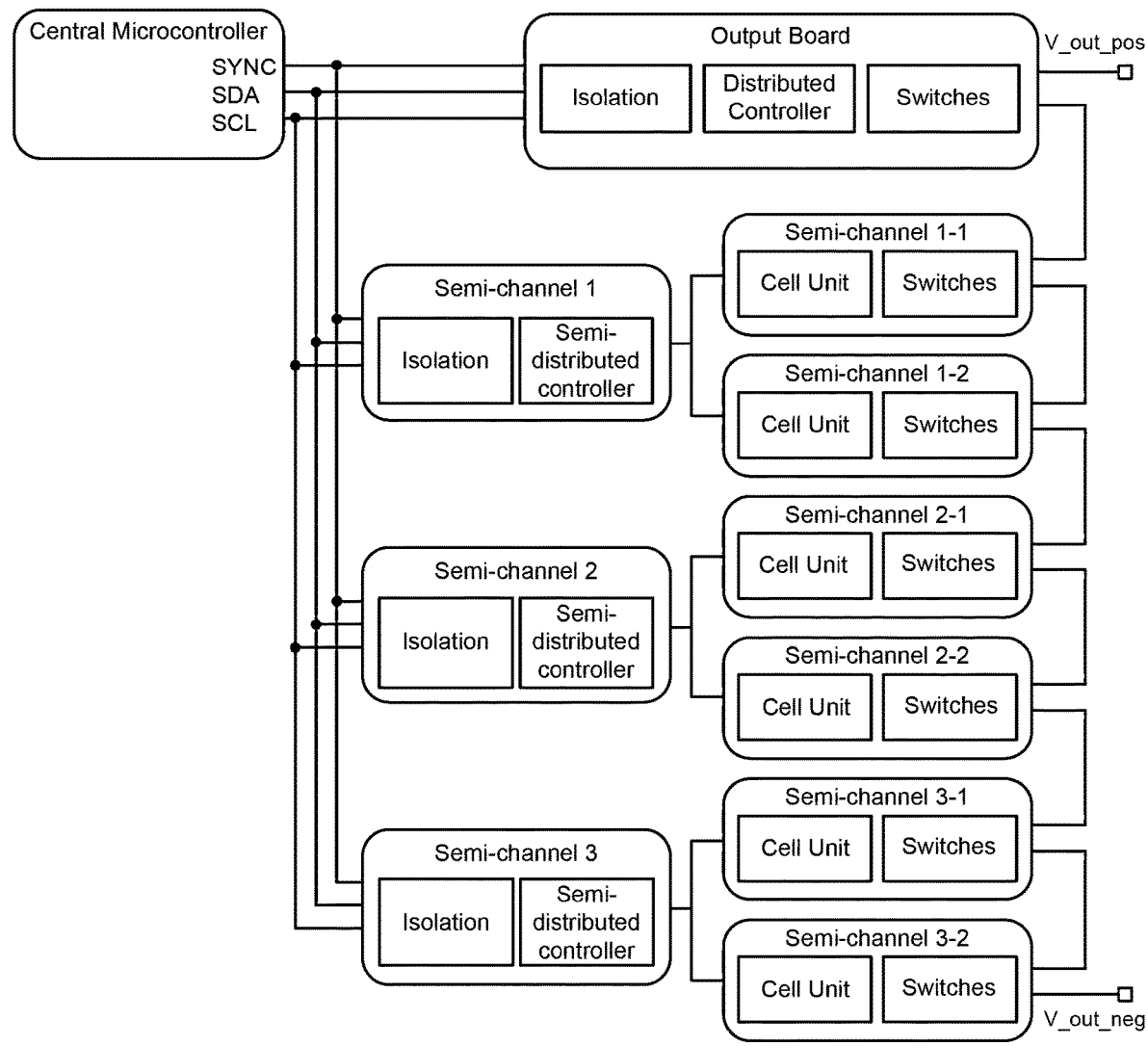
FIGS. 20 and 21 are schematic diagrams illustrating two example semi-centralised configuration for the battery system according to some embodiments of the invention.

FIG. 20 illustrates a battery system according to a further embodiment in which the central microcontroller communicates via a shared communication line with semi-distributed microcontrollers, which in turn have dedicated communication lines to the battery cell modules. In this embodiment, the electrical isolation is implemented on the communication signal between the central microcontroller and the semi-distributed microcontrollers. Each semi-distributed microcontroller therefore operates at a potential to ground that is equal or close to the potential to ground of the corresponding cell modules it controls.

Figure 21:
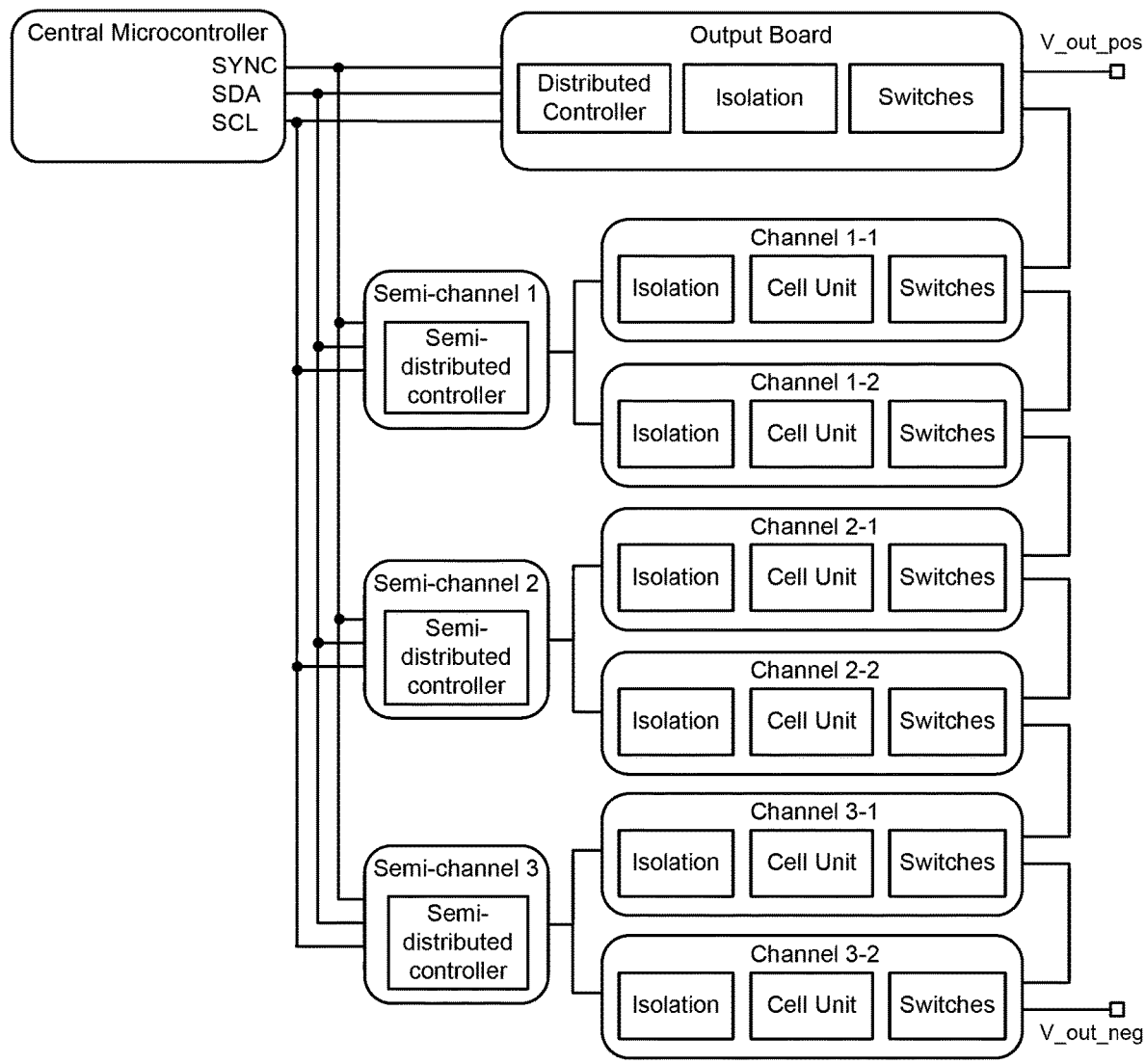

FIG. 21 illustrates a battery system according to a further embodiment in which the central microcontroller communicates via a shared communication line with semi-distributed microcontrollers, which in turn have dedicated communication lines to the battery cell modules. In this embodiment, the electrical isolation is implemented on the signal between the semi-distributed microcontrollers and the corresponding cell modules it controls. Each semi-distributed microcontroller therefore operates at a potential to ground that is equal or close to the potential to ground of other semi-distributed microcontrollers and/or the central microcontroller.

Figure 22:
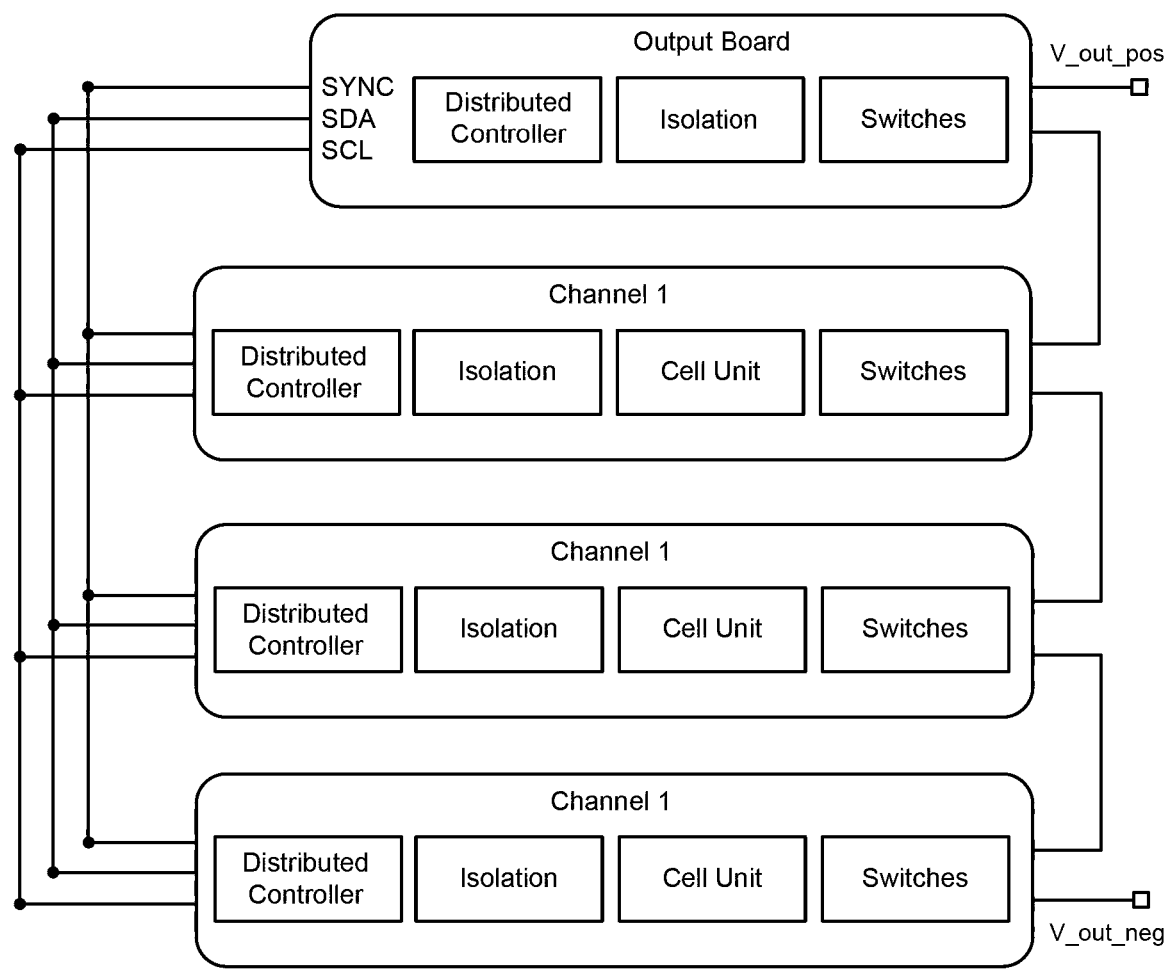
FIG. 22 is a schematic diagram illustrating a de-centralised configuration for the battery system excluding any dedicated central controller according to one embodiment of the invention.

FIG. 22 illustrates a battery system according to a further embodiment which has one or more shared communication lines between a number of distributed microcontrollers. Control decisions otherwise reserved for controller 104 are instead made individual by one, or jointly by several, of the distributed controllers.

Figure 23:
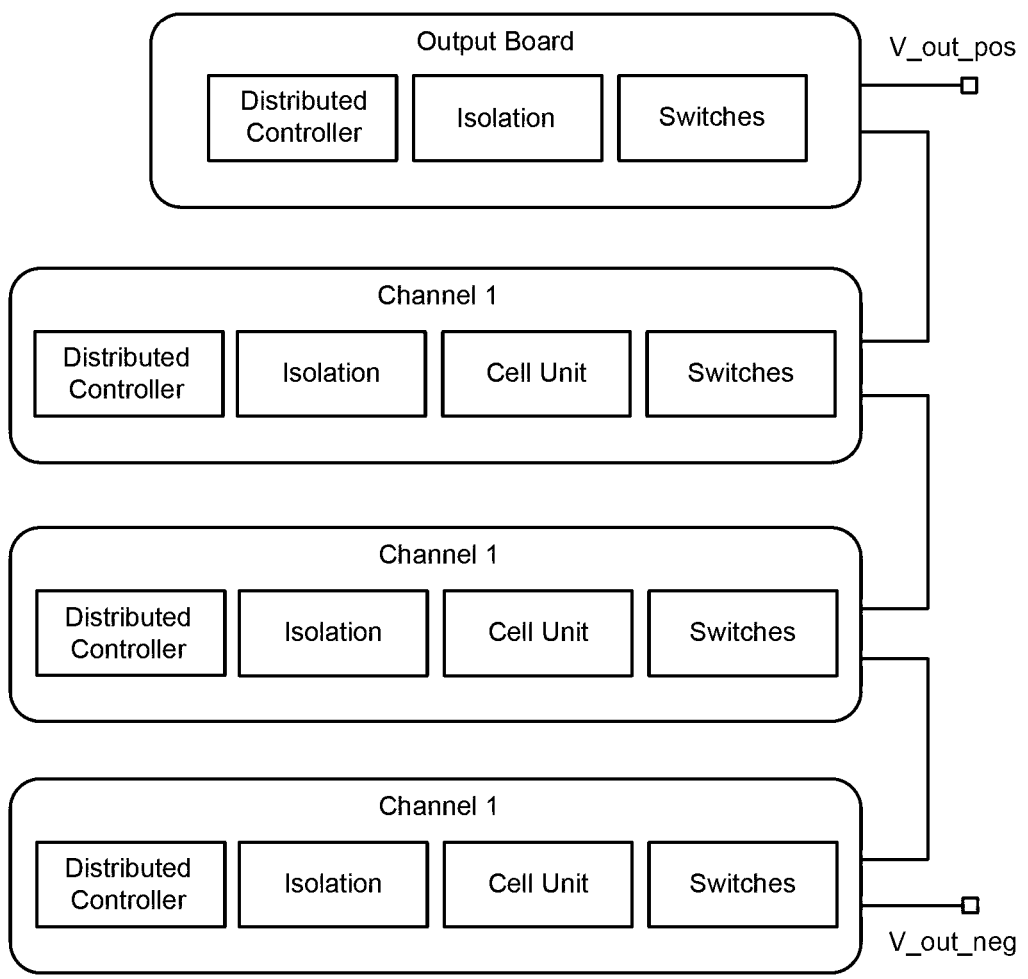
FIG. 23 is a schematic diagram illustrating a de-centralised configuration for the battery system excluding any dedicated central controller and utilizing power line communications according to one embodiment of the invention.

FIG. 23 illustrates a battery system according to a further embodiment in which a number of distributed microcontrollers communicate via the power line. Control decisions otherwise reserved for controller 104 are instead made individual by one, or jointly by several, of the distributed controllers.

INTERPRETATION

This specification, including the claims, is intended to be interpreted as follows:

Embodiments or examples described in the specification are intended to be illustrative of the invention, without limiting the scope thereof. The invention is capable of being practised with various modifications and additions as will readily occur to those skilled in the art. Accordingly, it is to be understood that the scope of the invention is not to be limited to the exact construction and operation described or illustrated, but only by the following claims.

The mere disclosure of a method step or product element in the specification should not be construed as being essential to the invention claimed herein, except where it is either expressly stated to be so or expressly recited in a claim.

The terms in the claims have the broadest scope of meaning they would have been given by a person of ordinary skill in the art as of the relevant date.

The terms "a" and "an" mean "one or more", unless expressly specified otherwise.

Neither the title nor the abstract of the present application is to be taken as limiting in any way as the scope of the claimed invention.

Where the preamble of a claim recites a purpose, benefit or possible use of the claimed invention, it does not limit the claimed invention to having only that purpose, benefit or possible use.

In the specification, including the claims, the term "comprise", and variants of that term such as "comprises" or "comprising", are used to mean "including but not limited to", unless expressly specified otherwise, or unless in the context or usage an exclusive interpretation of the term is required.

The disclosure of any document referred to herein is incorporated by reference into this patent application as part of the present disclosure, but only for purposes of written description and enablement and should in no way be used to limit, define, or otherwise construe any term of the present application where the present application, without such incorporation by reference, would not have failed to provide an ascertainable meaning. Any incorporation by reference does not, in and of itself, constitute any endorsement or ratification of any statement, opinion or argument contained in any incorporated document.

Reference to any background art or prior art in this specification is not an admission such background art or prior art constitutes common general knowledge in the relevant field or is otherwise admissible prior art in relation to the validity of the claims.

The claims defining the invention are as follows:

1. A battery system including
a plurality of battery cell units connected in series,
one or more switching assemblies, and
two or more controllers for determining one or more control parameters and controlling the switching assemblies based on the control parameters to selectively
disconnect any one of the battery cell units from being connected with any other battery cell units from the plurality of battery cell units, and
electrically connect in series any one of the battery cell units with any other battery cell unit from the plurality of battery cell units,
so as to provide a system output having a controllable voltage profile, the two or more controllers being configured for synchronised operation, and
wherein at least one of the controllers is configured to generate a synchronisation signal for time synchronisation of the two or more controllers.

2. A battery system of claim 1, wherein the controllers control the switching assemblies to selectively allow
operation in a first state in which a first battery cell unit and a second battery cell unit are electrically connected in series and a third battery cell unit is disconnected,
operation in a second state in which the first battery cell unit and the third battery cell unit are electrically connected in series and the second battery cell unit is disconnected, and
operation in a third state in which the second battery cell unit and the third battery cell unit are electrically connected in series and the first battery cell unit is disconnected.

3. The battery system of claim 1 further including a synchronisation line configured to communicate only a time synchronisation signal between the two or more controllers.

4. The battery system of claim 1, further including a synchronisation line configured to communicate at least a time synchronisation signal between the two or more controllers.

5. The battery system of claim 4, wherein the time synchronisation signal includes single time signals.

6. The battery system of claim 1, wherein the control parameters used by the two or more controllers to control the switching assemblies are based on a measure of at least one of: battery system voltage, battery system current, voltage provided to a connected load, a maximum charged voltage, a minimum discharged voltage for each battery cell, a cell voltage, and/or a combination of cell voltages.

7. The battery system of claim 1, wherein each battery cell unit is controlled by a respective controller.

8. The battery system of claim 1, wherein two or more battery cell units are controlled by a shared controller.

9. The battery system of claim 1, wherein at least one of the controllers is a central controller for generating a control signal for the one or more other controllers.

10. The battery system of claim 1, further including an output module for controlling the system output, wherein the output module has one or more output switches for selectively connecting or disconnecting the connected battery cell units to the system output.

11. The battery system of claim 1, further including a capacitor at the system output for smoothing an output voltage.

12. The battery system of claim 1, further including an inductor at the system output for smoothing an output current.

13. The battery system of claim 1, wherein the plurality of battery cell units includes at least two battery cell units having a difference in charge storage capacity of substantially 5% or more.

14. The battery system of claim 1, wherein one of the control parameters includes a time shift for each of the battery cell units, and wherein the time shift determines a time for electrically connecting the respective battery cell unit in series with one or more other battery cell units in the plurality of battery cell units.

15. The battery system of claim 1, wherein one of the control parameters includes a duty cycle for each of the battery cell units, and wherein the duty cycle determines a percentage of time for maintaining an electrical connection for the respective battery cell unit when it is electrically connected in series with one or more other battery cell units in the plurality of battery cell units.

16. The battery system of claim 1, wherein at least one switching assembly includes
gate drive electronics for receiving control signals from at least one of the controllers, the gate drive electronics having one or more isolation elements for isolating the at least one switching assembly from the controllers, and
one or more switching elements for conducting a current flowing in a direct electrical path between battery cell units connected in series; and
wherein the number of isolation elements is fewer than the number of switching elements.

17. The battery system of claim 16, wherein the gate drive electronics includes an opto-coupler.

18. The battery system of claim 1,
wherein a first switching assembly is configured to control one or more corresponding battery cell units, the first switching assembly including gate drive electronics for receiving control signals from at least one of the controllers,
wherein the gate drive electronics are at least partially powered by the one or more corresponding battery cell units.

19. The battery system of claim 1, wherein one or more of the switching assemblies each includes a maximum of two switching elements.

20. The battery system of claim 1, further including an AC/DC converter for converting a direct current signal at the battery system output into an alternating current.

21. The battery system of claim 1, further including an H-bridge circuit for converting a rectified sine wave output signal to a full sine wave output signal.

22. A battery pack system including two or more battery systems according to claim 1, wherein the two or more battery systems are electrically connected in parallel, the battery pack system being configured to regulate the system output of each of the battery systems.

* * * * *